(12) United States Patent
Gibson

(10) Patent No.: US 10,969,102 B2
(45) Date of Patent: *Apr. 6, 2021

(54) PORTABLE BIOMETRIC LIGHTER

(71) Applicant: JOHN GIBSON ENTERPRISES, INC., Beliot, WI (US)

(72) Inventor: John Gibson, Beloit, WI (US)

(73) Assignee: John Gibson Enterprises, Inc., Loves Park, IL (US)

(*) Notice: Subject to any disclaimer, the term of this patent is extended or adjusted under 35 U.S.C. 154(b) by 0 days.

This patent is subject to a terminal disclaimer.

(21) Appl. No.: 16/705,389

(22) Filed: Dec. 6, 2019

(65) Prior Publication Data
US 2020/0109856 A1 Apr. 9, 2020

Related U.S. Application Data

(63) Continuation of application No. 15/702,252, filed on Sep. 12, 2017, now Pat. No. 10,502,419.

(51) Int. Cl.
*F23Q 2/16* (2006.01)
*G06K 9/00* (2006.01)
*F23Q 2/32* (2006.01)
*F23Q 3/00* (2006.01)
*H01L 23/00* (2006.01)

(52) U.S. Cl.
CPC ............... *F23Q 2/164* (2013.01); *F23Q 2/16* (2013.01); *F23Q 2/32* (2013.01); *F23Q 3/002* (2013.01); *G06K 9/00013* (2013.01); *H01L 23/562* (2013.01)

(58) Field of Classification Search
CPC ........... F23Q 2/164; F23Q 2/32; F23Q 3/002; F23Q 2/16; G06K 9/00013
See application file for complete search history.

(56) References Cited

U.S. PATENT DOCUMENTS

| 2,520,328 A | 8/1950 | Nissen |
| 2,588,479 A | 3/1952 | Burchett |
| 3,450,143 A | 6/1969 | Tamarin |

(Continued)

FOREIGN PATENT DOCUMENTS

| JP | 2003322340 | 11/2003 |
| JP | 2005207607 | 8/2005 |

(Continued)

OTHER PUBLICATIONS

Advisory Action for U.S. Appl. No. 12/195,348 dated Dec. 2, 2011 (3982.003).

(Continued)

*Primary Examiner* — David J Laux
*Assistant Examiner* — Nikhil P Mashruwala
(74) *Attorney, Agent, or Firm* — Fitch, Even, Tabin & Flannery LLP

(57) ABSTRACT

A portable biometric lighter device (100) generally involving a control unit (210), a biometric sensor, such as a fingerprint sensor (140), wherein the biometric sensor is configured to scan a biometric data of a user and is operably coupled to the control unit (210), and an ignition element, wherein the ignition element is activated by the control unit (210) upon a match of the scanned biometric data of the user and a biometric data of an authorized user that is stored in a memory device.

12 Claims, 17 Drawing Sheets

Portable Biometric Lighter
Frontal Perspective View

(56) References Cited

U.S. PATENT DOCUMENTS

| | | |
|---|---|---|
| 3,547,566 A | 12/1970 | Tamarin |
| 3,744,953 A | 7/1973 | Herr |
| 3,860,385 A | 1/1975 | Nakanishi |
| 3,898,031 A | 8/1975 | Rusakowicz |
| 3,978,844 A | 9/1976 | Wilkens |
| 4,094,140 A | 6/1978 | Ohue |
| 4,191,173 A | 3/1980 | Dedeian |
| 4,253,818 A | 3/1981 | Ogawa |
| 4,403,945 A | 9/1983 | Leitgib |
| 4,512,328 A | 4/1985 | Arad |
| 4,538,983 A | 9/1985 | Zeller |
| 4,717,335 A | 1/1988 | Loveless |
| 4,758,152 A | 7/1988 | Kordecki |
| 4,784,601 A | 11/1988 | Nitta |
| 4,784,602 A | 11/1988 | Nitta |
| 4,786,248 A | 11/1988 | Nitta |
| 4,799,877 A | 1/1989 | Bisbee |
| 4,822,276 A | 4/1989 | Bisbee |
| 4,829,981 A | 5/1989 | Burrell |
| 4,830,603 A | 5/1989 | Cirami |
| 4,832,596 A | 5/1989 | Morris, Sr. |
| 4,859,172 A | 8/1989 | Nitta |
| 4,869,663 A | 9/1989 | Fremund |
| 4,904,180 A | 2/1990 | Nitta |
| 4,921,420 A | 5/1990 | Johnston |
| 4,975,978 A | 12/1990 | Ando |
| 5,002,482 A | 3/1991 | Fairbanks |
| 5,017,128 A | 5/1991 | Hunter |
| 5,035,608 A | 7/1991 | Parren |
| 5,066,220 A | 11/1991 | Vick |
| 5,074,781 A | 12/1991 | Fujita |
| 5,076,783 A | 12/1991 | Fremund |
| 5,085,578 A | 2/1992 | Hunter |
| 5,090,893 A | 2/1992 | Floriot |
| 5,092,764 A | 3/1992 | McDonough |
| 5,096,414 A | 3/1992 | Zellweger |
| 5,104,313 A | 4/1992 | Zellweger |
| 5,120,215 A | 6/1992 | AmorosNollas |
| 5,145,358 A | 9/1992 | Shike |
| 5,165,885 A | 11/1992 | Iwahori |
| 5,165,886 A | 11/1992 | Frigiere |
| 5,171,143 A | 12/1992 | Sohn |
| 5,184,948 A | 2/1993 | Iwahori |
| 5,186,618 A | 2/1993 | Shike |
| 5,197,870 A | 3/1993 | Yang |
| 5,205,729 A | 4/1993 | Iwahori |
| 5,213,493 A | 5/1993 | Iwahori |
| 5,213,495 A | 5/1993 | Pan |
| D336,815 S | 6/1993 | Cashin |
| 5,215,458 A | 6/1993 | Cirami |
| 5,217,364 A | 6/1993 | Frigiere |
| 5,217,365 A | 6/1993 | Frigiere |
| 5,224,854 A | 7/1993 | Ansquer |
| 5,228,849 A | 7/1993 | Frigiere |
| 5,236,351 A | 8/1993 | Tien |
| 5,240,408 A | 8/1993 | Uematsu |
| 5,242,297 A | 9/1993 | Cirami |
| 5,271,731 A | 12/1993 | Hsin-Chung |
| 5,284,439 A | 2/1994 | Shike |
| 5,288,226 A | 2/1994 | Khemarangsan |
| 5,295,819 A | 3/1994 | GomezLopez |
| 5,324,193 A | 6/1994 | Pan |
| 5,332,387 A | 7/1994 | Sheng |
| 5,334,011 A | 8/1994 | Frigiere |
| 5,348,467 A | 9/1994 | Piffath |
| 5,350,294 A | 9/1994 | Iwahori |
| 5,356,286 A | 10/1994 | Sher |
| 5,364,261 A | 11/1994 | Huang |
| 5,387,101 A | 2/1995 | Chan |
| 5,401,163 A | 3/1995 | Yamazaki |
| 5,407,346 A | 4/1995 | Sher |
| 5,409,372 A | 4/1995 | Nobuo |
| 5,417,563 A | 5/1995 | Cirami |
| 5,417,571 A | 5/1995 | Kvalseth |
| 5,421,720 A | 6/1995 | Sher |
| 5,427,522 A | 6/1995 | McDonough |
| 5,427,523 A | 6/1995 | Yiu |
| 5,431,558 A | 7/1995 | McDonough |
| 5,435,719 A | 7/1995 | McDonough |
| 5,437,549 A | 8/1995 | Saito |
| 5,439,375 A | 8/1995 | Wang |
| 5,445,518 A | 8/1995 | McDonough |
| 5,451,159 A | 9/1995 | Kim |
| 5,454,713 A | 10/1995 | Lee |
| 5,456,598 A | 10/1995 | McDonough |
| 5,458,482 A | 10/1995 | Saito |
| 5,460,516 A | 10/1995 | Sher |
| 5,460,521 A | 10/1995 | Tsai |
| 5,462,432 A | 10/1995 | Kim |
| 5,472,338 A | 12/1995 | Ansquer |
| 5,483,978 A | 1/1996 | Doiron |
| 5,487,657 A | 1/1996 | Fairbanks |
| 5,490,773 A | 2/1996 | LloverasCapilla |
| 5,492,468 A | 2/1996 | Cirami |
| 5,494,436 A | 2/1996 | Hwang |
| 5,531,591 A | 7/1996 | Yamazaki |
| 5,538,417 A | 7/1996 | Chan |
| 5,547,370 A | 8/1996 | Hwang |
| 5,558,514 A | 9/1996 | Ansquer |
| 5,584,682 A | 12/1996 | McDonough |
| 5,584,683 A | 12/1996 | Sher |
| 5,597,299 A | 1/1997 | Jon |
| 5,607,295 A | 3/1997 | Khemarangsan |
| 5,624,254 A | 4/1997 | Kee |
| 5,628,627 A | 5/1997 | Fairbanks |
| 5,634,787 A | 6/1997 | Frigiere |
| 5,636,979 A | 6/1997 | McDonough |
| 5,642,993 A | 7/1997 | McDonough |
| 5,645,414 A | 7/1997 | Wang |
| 5,645,415 A | 7/1997 | Hamel |
| 5,655,901 A | 8/1997 | Makoto |
| 5,655,902 A | 8/1997 | Doucet |
| 5,662,466 A | 9/1997 | Cheng |
| 5,676,537 A | 10/1997 | Fang |
| 5,690,094 A | 11/1997 | Sheinfeld |
| 5,697,775 A | 12/1997 | Saito |
| 5,704,776 A | 1/1998 | Sher |
| 5,743,725 A | 4/1998 | Chan |
| 5,755,578 A | 5/1998 | Contant |
| 5,759,023 A | 6/1998 | Jenlis |
| 5,769,098 A | 6/1998 | McDonough |
| 5,769,625 A | 6/1998 | Sher |
| 5,788,474 A | 8/1998 | Chung |
| 5,788,476 A | 8/1998 | Sher |
| 5,823,765 A | 10/1998 | LaForest |
| 5,829,963 A | 11/1998 | Ichikawa |
| 5,833,448 A | 11/1998 | Doucet |
| 5,836,755 A | 11/1998 | Sheng |
| 5,839,892 A | 11/1998 | Hwang |
| 5,846,069 A | 12/1998 | Sher |
| 5,854,530 A | 12/1998 | LaForest |
| 5,868,561 A | 2/1999 | Rogelet |
| 5,882,186 A | 3/1999 | KaiMan |
| 5,897,307 A | 4/1999 | Chang |
| 5,897,308 A | 4/1999 | Saito |
| 5,913,674 A | 6/1999 | Shimizu |
| 5,915,953 A | 6/1999 | Mifune |
| 5,931,656 A | 8/1999 | Kanno |
| 5,934,895 A | 8/1999 | McDonough |
| 5,947,715 A | 9/1999 | Sheng |
| 5,957,680 A | 9/1999 | Doucet |
| 5,967,768 A | 10/1999 | Saito |
| 5,971,748 A | 10/1999 | Rogelet |
| 5,971,749 A | 10/1999 | Chen |
| 5,971,751 A | 10/1999 | Lee |
| 5,980,239 A | 11/1999 | Doucet |
| 5,980,242 A | 11/1999 | Man |
| 5,997,281 A | 12/1999 | Lei |
| 5,997,282 A | 12/1999 | Man |
| 6,010,328 A | 1/2000 | Sung |
| 6,012,916 A | 1/2000 | Liang |
| 6,022,211 A | 2/2000 | Wang |
| 6,022,212 A | 2/2000 | Saito |
| 6,039,561 A | 3/2000 | Lei |

(56) References Cited

U.S. PATENT DOCUMENTS

| | | |
|---|---|---|
| 6,039,562 A | 3/2000 | Li |
| 6,042,367 A | 3/2000 | Saito |
| 6,045,354 A | 4/2000 | McDonough |
| 6,046,528 A | 4/2000 | LaForest |
| 6,050,810 A | 4/2000 | Huang |
| 6,050,811 A | 4/2000 | Stein |
| 6,053,727 A | 4/2000 | Potskhishvili |
| 6,059,563 A | 5/2000 | Hsu |
| 6,065,958 A | 5/2000 | Adams |
| 6,074,198 A | 6/2000 | Rogelet |
| 6,077,069 A | 6/2000 | Fairbanks |
| 6,077,070 A | 6/2000 | Doucet |
| 6,077,071 A | 6/2000 | Yeh |
| 6,086,358 A | 7/2000 | Potskhishvili |
| 6,086,359 A | 7/2000 | Sher |
| 6,093,017 A | 7/2000 | Saito |
| 6,095,795 A | 8/2000 | Potskhishvili |
| 6,095,796 A | 8/2000 | Sung |
| 6,099,296 A | 8/2000 | Wang |
| 6,099,297 A | 8/2000 | Chan |
| 6,099,298 A | 8/2000 | Potskhishvili |
| 6,102,689 A | 8/2000 | Man |
| 6,106,277 A | 8/2000 | Xie |
| 6,116,892 A | 9/2000 | Yang |
| 6,123,541 A | 9/2000 | Yang |
| 6,126,437 A | 10/2000 | Lixiang |
| 6,129,543 A | 10/2000 | Potskhishvili |
| 6,129,544 A | 10/2000 | Chen |
| 6,131,464 A | 10/2000 | Pare, Jr. |
| 6,135,761 A | 10/2000 | Chen |
| 6,135,762 A | 10/2000 | Hu |
| 6,135,763 A | 10/2000 | Man |
| 6,142,766 A | 11/2000 | Hu |
| 6,142,767 A | 11/2000 | Chan |
| 6,142,768 A | 11/2000 | Feng |
| 6,146,128 A | 11/2000 | Feng |
| 6,146,129 A | 11/2000 | Li |
| 6,168,420 B1 | 1/2001 | Sung |
| 6,168,421 B1 | 1/2001 | Hsieh |
| 6,168,423 B1 | 1/2001 | Man |
| 6,171,099 B1 | 1/2001 | Lin |
| 6,186,772 B1 | 2/2001 | Huang |
| 6,186,773 B1 | 2/2001 | Sung |
| 6,200,130 B1 | 3/2001 | Man |
| 6,206,689 B1 | 3/2001 | Doucet |
| 6,213,759 B1 | 4/2001 | Sung |
| 6,217,313 B1 | 4/2001 | Luo |
| 6,220,853 B1 | 4/2001 | Luo |
| 6,224,368 B1 | 5/2001 | Chung |
| 6,231,335 B1 | 5/2001 | Huang |
| 6,234,784 B1 | 5/2001 | Yoshinaga |
| 6,244,858 B1 | 6/2001 | Wang |
| 6,264,463 B1 | 7/2001 | Sung |
| 6,267,582 B1 | 7/2001 | Lin |
| 6,273,709 B1 | 8/2001 | Potskhishvili |
| 6,287,109 B1 | 9/2001 | Hirota |
| 6,299,434 B1 | 10/2001 | Sung |
| 6,315,550 B1 | 11/2001 | Sher |
| 6,318,992 B1 | 11/2001 | Sung |
| 6,325,617 B1 | 12/2001 | Sung |
| 6,328,555 B1 | 12/2001 | Park |
| 6,332,771 B1 | 12/2001 | Adams |
| 6,332,772 B2 | 12/2001 | Sung |
| 6,336,807 B1 | 1/2002 | Hsu |
| 6,343,928 B1 | 2/2002 | Liang |
| 6,352,429 B1 | 3/2002 | Sher |
| 6,382,416 B1 | 5/2002 | Gainey |
| 6,386,861 B1 | 5/2002 | Sher |
| 6,390,809 B1 | 5/2002 | Gerace |
| 6,402,506 B1 | 6/2002 | Lin |
| 6,419,479 B1 | 7/2002 | Huang |
| 6,422,860 B2 | 7/2002 | Sung |
| 6,428,309 B1 | 8/2002 | Doiron |
| 6,431,853 B1 | 8/2002 | Sher |
| 6,431,854 B1 | 8/2002 | Fang |
| 6,435,859 B1 | 8/2002 | Jon |
| 6,439,879 B1 | 8/2002 | Hsu |
| 6,443,727 B1 | 9/2002 | Huang |
| 6,447,287 B1 | 9/2002 | Hsu |
| 6,454,560 B1 | 9/2002 | Chen |
| 6,468,070 B1 | 10/2002 | Jon |
| 6,478,575 B2 | 11/2002 | Sher |
| 6,485,291 B2 | 11/2002 | Adams |
| 6,488,492 B2 | 12/2002 | Adams |
| 6,488,493 B2 | 12/2002 | Sung |
| 6,491,515 B1 | 12/2002 | Tubby |
| 6,494,709 B1 | 12/2002 | Li |
| 6,506,046 B1 | 1/2003 | Luo |
| 6,520,768 B1 | 2/2003 | Hsu |
| 6,527,542 B1 | 3/2003 | Chen |
| 6,527,546 B1 | 3/2003 | Laforest |
| 6,533,575 B2 | 3/2003 | Man |
| 6,533,576 B1 | 3/2003 | Sher |
| 6,540,506 B1 | 4/2003 | Li |
| 6,540,507 B1 | 4/2003 | Yang |
| 6,551,096 B2 | 4/2003 | Saito |
| 6,551,097 B1 | 4/2003 | Huang |
| 6,565,353 B2 | 5/2003 | Yang |
| 6,565,354 B2 | 5/2003 | Liang |
| 6,575,735 B2 | 6/2003 | LloverasCapilla |
| 6,592,362 B2 | 7/2003 | Fisher |
| 6,595,770 B2 | 7/2003 | Hsu |
| 6,599,120 B1 | 7/2003 | Lin |
| 6,604,939 B1 | 8/2003 | Li |
| 6,612,831 B1 | 9/2003 | Ansquer |
| 6,612,832 B1 | 9/2003 | Huang |
| 6,616,443 B2 | 9/2003 | Saito |
| 6,638,056 B2 | 10/2003 | Luo |
| 6,641,389 B1 | 11/2003 | Huang |
| 6,641,391 B1 | 11/2003 | Xu |
| 6,644,958 B1 | 11/2003 | Li |
| 6,648,629 B2 | 11/2003 | Ichikawa |
| 6,648,630 B2 | 11/2003 | Tse |
| 6,659,763 B2 | 12/2003 | Fisher |
| 6,659,764 B2 | 12/2003 | Xu |
| 6,663,382 B2 | 12/2003 | Li |
| 6,663,383 B2 | 12/2003 | Jon |
| 6,666,677 B1 | 12/2003 | Ichikawa |
| 6,666,678 B2 | 12/2003 | Sung |
| 6,666,679 B1 | 12/2003 | Ye |
| 6,669,465 B2 | 12/2003 | Yang |
| 6,676,405 B2 | 1/2004 | Sewalt |
| 6,682,340 B2 | 1/2004 | Kim |
| 6,682,341 B2 | 1/2004 | Pan |
| 6,688,878 B1 | 2/2004 | Rogelet |
| 6,688,879 B2 | 2/2004 | Tsai |
| 6,692,247 B2 | 2/2004 | Sewalt |
| 6,695,610 B2 | 2/2004 | Tsang |
| 6,703,590 B1 | 3/2004 | Holley, Jr. |
| 6,716,024 B2 | 4/2004 | Jon |
| 6,722,877 B2 | 4/2004 | Wang |
| 6,726,469 B2 | 4/2004 | Adams |
| 6,733,277 B2 | 5/2004 | Huang |
| 6,736,630 B1 | 5/2004 | Miyanaga |
| 6,739,867 B2 | 5/2004 | Puig-Gros |
| 6,755,642 B2 | 6/2004 | Zhang |
| 6,764,300 B2 | 7/2004 | Sewalt |
| 6,765,338 B2 | 7/2004 | Orazietti |
| 6,786,715 B1 | 9/2004 | Saito |
| 6,792,287 B1 | 9/2004 | Tuomela |
| 6,796,791 B1 | 9/2004 | Chung |
| 6,808,386 B2 | 10/2004 | Huang |
| 6,808,387 B1 | 10/2004 | Li |
| 6,814,569 B2 | 11/2004 | Sung |
| 6,832,910 B2 | 12/2004 | Chung |
| 6,837,703 B2 | 1/2005 | Saito |
| 6,837,704 B2 | 1/2005 | Hsu |
| 6,840,759 B2 | 1/2005 | Aronson, II |
| 6,849,990 B2 | 2/2005 | Li |
| 6,860,733 B2 | 3/2005 | Zhang |
| 6,887,072 B2 | 5/2005 | Judeng |
| 6,893,254 B2 | 5/2005 | Jiang |
| 6,908,302 B2 | 6/2005 | Sgroi, Jr. |
| 6,918,758 B2 | 7/2005 | Yang |

(56) References Cited

U.S. PATENT DOCUMENTS

| | | |
|---|---|---|
| 6,926,518 B1 | 8/2005 | Chung |
| 6,939,128 B2 | 9/2005 | Suzuki |
| 6,939,129 B2 | 9/2005 | Hsu |
| 6,945,772 B2 | 9/2005 | Chang |
| 6,948,927 B2 | 9/2005 | Yang |
| 6,951,457 B2 | 10/2005 | Li |
| 6,962,493 B2 | 11/2005 | Luo |
| 6,971,870 B2 | 12/2005 | Sgroi, Jr. |
| 6,979,190 B2 | 12/2005 | Ichikawa |
| 6,988,884 B2 | 1/2006 | Wong |
| 6,997,700 B2 | 2/2006 | Kim |
| 7,001,174 B2 | 2/2006 | Hu |
| 7,001,175 B2 | 2/2006 | Yang |
| 7,004,750 B2 | 2/2006 | Luo |
| 7,029,270 B2 | 4/2006 | Wong |
| 7,052,272 B2 | 5/2006 | Sung |
| 7,068,145 B2 | 6/2006 | Reitmeier |
| 7,102,486 B2 | 9/2006 | Yamagishi |
| 7,104,786 B2 | 9/2006 | Luo |
| 7,128,568 B2 | 10/2006 | Yang |
| 7,147,463 B2 | 12/2006 | Wong |
| 7,165,969 B2 | 1/2007 | Yang |
| 7,175,425 B2 | 2/2007 | Sung |
| 7,182,592 B2 | 2/2007 | Perez |
| 7,223,097 B2 | 5/2007 | Perez |
| 7,244,120 B2 | 7/2007 | Jiang |
| 7,252,504 B2 | 8/2007 | Lin |
| 7,300,276 B2 | 11/2007 | Sun |
| 7,303,389 B2 | 12/2007 | Li |
| 7,311,518 B2 | 12/2007 | Sgroi |
| 7,314,371 B2 | 1/2008 | Hsu |
| 7,364,427 B2 | 4/2008 | Huang |
| 7,369,685 B2 | 5/2008 | DeLean |
| 7,512,806 B2 | 3/2009 | Lemke |
| 7,556,494 B2 | 7/2009 | Huang |
| 7,581,947 B2 | 9/2009 | Shan |
| 7,591,645 B2 | 9/2009 | Sewalt |
| 7,600,996 B2 | 10/2009 | Ruan |
| 7,614,874 B2 | 11/2009 | Mochizuki |
| 7,641,471 B2 | 1/2010 | Chung |
| 7,682,148 B2 | 3/2010 | Mochizuki |
| 7,736,144 B2 | 6/2010 | Sun |
| 7,744,368 B2 | 6/2010 | Frigiere |
| 7,942,665 B2 | 5/2011 | Kotani |
| RE42,750 E | 9/2011 | Lee |
| 8,045,961 B2 | 10/2011 | Ayed |
| 8,109,760 B2 | 2/2012 | Berkovits |
| 8,112,066 B2 | 2/2012 | BenAyed |
| 8,190,129 B2 | 5/2012 | BenAyed |
| 8,241,033 B2 | 8/2012 | Shimizu |
| 8,260,262 B2 | 9/2012 | BenAyed |
| 8,498,618 B2 | 7/2013 | BenAyed |
| 8,653,942 B2 | 2/2014 | Gibson |
| 8,747,107 B2 | 6/2014 | Mok |
| 8,840,398 B2 | 9/2014 | Lee |
| 2001/0023054 A1 | 9/2001 | Sung |
| 2001/0041315 A1 | 11/2001 | Sung |
| 2001/0044085 A1 | 11/2001 | Sung |
| 2002/0009684 A1 | 1/2002 | Sung |
| 2002/0025499 A1 | 2/2002 | Adams |
| 2002/0039712 A1 | 4/2002 | Saito |
| 2002/0055076 A1 | 5/2002 | Adams |
| 2002/0055077 A1 | 5/2002 | Adams |
| 2002/0061486 A1 | 5/2002 | Huang |
| 2002/0061487 A1 | 5/2002 | Huang |
| 2002/0061488 A1 | 5/2002 | Sung |
| 2002/0064744 A1 | 5/2002 | Tse |
| 2002/0072022 A1 | 6/2002 | Hsu |
| 2002/0076667 A1 | 6/2002 | Man |
| 2002/0086256 A1 | 7/2002 | Sung |
| 2002/0090586 A1 | 7/2002 | Adams |
| 2002/0094499 A1 | 7/2002 | Huang |
| 2002/0094500 A1 | 7/2002 | Tse |
| 2002/0106600 A1 | 8/2002 | Sher |
| 2002/0106601 A1 | 8/2002 | Adams |
| 2002/0110768 A1 | 8/2002 | Sher |
| 2002/0115031 A1 | 8/2002 | Chen |
| 2002/0115032 A1 | 8/2002 | Tsai |
| 2002/0119409 A1 | 8/2002 | Amoros |
| 2002/0119410 A1 | 8/2002 | Sewalt |
| 2002/0119411 A1 | 8/2002 | Trober |
| 2002/0132200 A1 | 9/2002 | Hurng |
| 2002/0132201 A1 | 9/2002 | Zhang |
| 2002/0136996 A1 | 9/2002 | Ichikawa |
| 2002/0150852 A1 | 10/2002 | Zhang |
| 2002/0150853 A1 | 10/2002 | Cowl |
| 2002/0155407 A1 | 10/2002 | Li |
| 2002/0160328 A1 | 10/2002 | Tsang |
| 2002/0160329 A1 | 10/2002 | Zhang |
| 2002/0177091 A1 | 11/2002 | Chen |
| 2002/0180313 A1 | 12/2002 | Orazietti |
| 2002/0182554 A1 | 12/2002 | Fisher |
| 2002/0192612 A1 | 12/2002 | Pan |
| 2002/0197576 A1 | 12/2002 | Xu |
| 2002/0197577 A1 | 12/2002 | Sher |
| 2003/0003412 A1 | 1/2003 | ChungYang |
| 2003/0013058 A1 | 1/2003 | Sher |
| 2003/0022117 A1 | 1/2003 | Sewalt |
| 2003/0022120 A1 | 1/2003 | Liang |
| 2003/0031967 A1 | 2/2003 | Sewalt |
| 2003/0031968 A1 | 2/2003 | Sewalt |
| 2003/0039934 A1 | 2/2003 | Wang |
| 2003/0049576 A1 | 3/2003 | Jon |
| 2003/0068594 A1 | 4/2003 | Luo |
| 2003/0096206 A1 | 5/2003 | Saito |
| 2003/0104329 A1 | 6/2003 | Laforest |
| 2003/0108836 A1 | 6/2003 | Fisher |
| 2003/0108837 A1 | 6/2003 | Yang |
| 2003/0118961 A1 | 6/2003 | Hsu |
| 2003/0124476 A1 | 7/2003 | ChungYang |
| 2003/0129554 A1 | 7/2003 | Aronson |
| 2003/0143504 A1 | 7/2003 | Chung |
| 2003/0143505 A1 | 7/2003 | Puig-Gros |
| 2003/0157449 A1 | 8/2003 | Suzuki |
| 2003/0190076 A1 | 10/2003 | DeLean |
| 2003/0194669 A1 | 10/2003 | Chang |
| 2003/0194670 A1 | 10/2003 | Huang |
| 2003/0203331 A1 | 10/2003 | Hsu |
| 2003/0207223 A1 | 11/2003 | Li |
| 2003/0219687 A1 | 11/2003 | Kim |
| 2003/0232297 A1 | 12/2003 | Pareek |
| 2004/0023178 A1 | 2/2004 | Sgroi |
| 2004/0033462 A1 | 2/2004 | Zhang |
| 2004/0041689 A1 | 3/2004 | DeBono |
| 2004/0043346 A1 | 3/2004 | Jon |
| 2004/0053179 A1 | 3/2004 | Rogelet |
| 2004/0058289 A1 | 3/2004 | Huang |
| 2004/0063055 A1 | 4/2004 | Yang |
| 2004/0081931 A1 | 4/2004 | Sgroi |
| 2004/0096791 A1 | 5/2004 | Ichikawa |
| 2004/0096792 A1 | 5/2004 | Puig-Gros |
| 2004/0121276 A1 | 6/2004 | Erdmann |
| 2004/0130244 A1 | 7/2004 | Li |
| 2004/0131985 A1 | 7/2004 | Saito |
| 2004/0137394 A1 | 7/2004 | Sung |
| 2004/0146823 A1 | 7/2004 | Jiang |
| 2004/0146824 A1 | 7/2004 | Sewalt |
| 2004/0155752 A1 | 8/2004 | Radke |
| 2004/0160335 A1 | 8/2004 | Reitmeier |
| 2004/0166453 A1 | 8/2004 | Adams |
| 2004/0191713 A1 | 9/2004 | ChungYang |
| 2004/0191714 A1 | 9/2004 | Luo |
| 2004/0191715 A1 | 9/2004 | Nakamura |
| 2004/0224270 A1 | 11/2004 | Yang |
| 2005/0014101 A1 | 1/2005 | Hsu |
| 2005/0037304 A1 | 2/2005 | Serizawa |
| 2005/0042561 A1 | 2/2005 | Hu |
| 2005/0042562 A1 | 2/2005 | Lei |
| 2005/0053880 A1 | 3/2005 | Kim |
| 2005/0053881 A1 | 3/2005 | Sgroi |
| 2005/0064355 A1 | 3/2005 | Sung |
| 2005/0069829 A1 | 3/2005 | Hsu |
| 2005/0079460 A1 | 4/2005 | Wong |
| 2005/0084813 A1 | 4/2005 | Wong |

(56) References Cited

U.S. PATENT DOCUMENTS

| | | |
|---|---|---|
| 2005/0100845 A1 | 5/2005 | Yang |
| 2005/0118546 A1 | 6/2005 | Luo |
| 2005/0118547 A1 | 6/2005 | Li |
| 2005/0142510 A1 | 6/2005 | Jiang |
| 2005/0164140 A1 | 7/2005 | Luo |
| 2005/0170303 A1 | 8/2005 | Huang |
| 2005/0170304 A1 | 8/2005 | Chung |
| 2005/0175946 A1 | 8/2005 | Lei |
| 2005/0196717 A1 | 9/2005 | Wong |
| 2005/0202359 A1 | 9/2005 | Lin |
| 2005/0227192 A1 | 10/2005 | Sgroi |
| 2005/0229918 A1 | 10/2005 | Shim |
| 2005/0239008 A1 | 10/2005 | Sung |
| 2005/0244766 A9 | 11/2005 | Sung |
| 2005/0257411 A1 | 11/2005 | Wootton |
| 2005/0266366 A1 | 12/2005 | Wu |
| 2005/0277077 A1 | 12/2005 | Yang |
| 2005/0287488 A1 | 12/2005 | Li |
| 2006/0024630 A1 | 2/2006 | Williamson |
| 2006/0035185 A1 | 2/2006 | Chan |
| 2006/0035186 A1 | 2/2006 | Perez |
| 2006/0035187 A1 | 2/2006 | Perez |
| 2006/0073432 A1 | 4/2006 | Frigiere |
| 2006/0099541 A1 | 5/2006 | Huang |
| 2006/0105282 A1 | 5/2006 | Lang |
| 2006/0147858 A1 | 7/2006 | Chung |
| 2006/0181521 A1 | 8/2006 | Perreault |
| 2006/0216664 A1 | 9/2006 | Lin |
| 2006/0223017 A1 | 10/2006 | Sun |
| 2006/0223018 A1 | 10/2006 | Liu |
| 2006/0269882 A1 | 11/2006 | Wu |
| 2006/0269883 A1 | 11/2006 | Wu |
| 2006/0281034 A1 | 12/2006 | Ruan |
| 2006/0281035 A1 | 12/2006 | Ruan |
| 2006/0281037 A1 | 12/2006 | Faber |
| 2006/0286496 A1 | 12/2006 | Tu |
| 2006/0293892 A1 | 12/2006 | Pathuel |
| 2007/0009844 A1 | 1/2007 | Wu |
| 2007/0020569 A1 | 1/2007 | Hsu |
| 2007/0048681 A1 | 3/2007 | Wong |
| 2007/0081696 A1 | 4/2007 | Brennan |
| 2007/0107715 A1 | 5/2007 | Grunberg |
| 2007/0172782 A1 | 7/2007 | Weicheng |
| 2007/0224566 A1 | 9/2007 | Ruan |
| 2007/0252898 A1 | 11/2007 | Delean |
| 2007/0281261 A1 | 12/2007 | Huang |
| 2007/0287112 A1 | 12/2007 | Lai |
| 2007/0287113 A1 | 12/2007 | Lai |
| 2007/0287114 A1 | 12/2007 | Huang |
| 2008/0044780 A1 | 2/2008 | Berkovits |
| 2008/0050686 A1 | 2/2008 | Sewalt |
| 2008/0070173 A1 | 3/2008 | Sgroi |
| 2008/0076083 A1 | 3/2008 | Hsu |
| 2008/0090190 A1 | 4/2008 | Sun |
| 2008/0206694 A1 | 8/2008 | Sewalt |
| 2008/0213711 A1 | 9/2008 | Huang |
| 2008/0213712 A1 | 9/2008 | Huang |
| 2008/0220386 A1 | 9/2008 | Mochizuki |
| 2008/0241773 A1 | 10/2008 | Mochizuki |
| 2009/0004613 A1 | 1/2009 | Shan |
| 2009/0029301 A1 | 1/2009 | Shimizu |
| 2009/0061371 A1 | 3/2009 | Fang |
| 2009/0087803 A1 | 4/2009 | Tao |
| 2009/0098493 A1 | 4/2009 | Huang |
| 2009/0104574 A1 | 4/2009 | Ruan |
| 2009/0191496 A1 | 7/2009 | Hsu |
| 2009/0197213 A1 | 8/2009 | Huang |
| 2009/0246721 A1 | 10/2009 | Wu |
| 2010/0021854 A1 | 1/2010 | Kotani |
| 2010/0045430 A1* | 2/2010 | Gibson .............. G06K 9/00013 340/5.82 |
| 2010/0047729 A1 | 2/2010 | Yang |
| 2010/0062383 A1 | 3/2010 | DominguezEsteban |
| 2010/0081101 A1 | 4/2010 | Shan |
| 2010/0092899 A1 | 4/2010 | Hsu |
| 2010/0099053 A1 | 4/2010 | Lai |
| 2010/0190121 A1 | 7/2010 | Mochizuki |
| 2010/0216081 A1 | 8/2010 | Huang |
| 2010/0321151 A1 | 12/2010 | Matsuura |
| 2010/0321152 A1 | 12/2010 | Argudyaev |
| 2011/0091825 A1 | 4/2011 | Huang |
| 2011/0097675 A1 | 4/2011 | Deng |
| 2011/0137657 A1 | 6/2011 | Cenedese |
| 2011/0215921 A1 | 9/2011 | BenAyed |
| 2011/0293095 A1 | 12/2011 | BenAyed |
| 2011/0313922 A1 | 12/2011 | BenAyed |
| 2012/0019361 A1 | 1/2012 | BenAyed |
| 2012/0019379 A1 | 1/2012 | BenAyed |
| 2012/0183912 A1 | 7/2012 | Mok |
| 2012/0204853 A1 | 8/2012 | Simmons |
| 2012/0251961 A1 | 10/2012 | Lee |
| 2012/0270163 A1 | 10/2012 | Adams |
| 2013/0164698 A1 | 6/2013 | Lefebvre |
| 2014/0175081 A1 | 6/2014 | Hwa |
| 2014/0193049 A1 | 7/2014 | Gibson |
| 2016/0267340 A1* | 9/2016 | Jensen .............. G06K 9/00885 |

FOREIGN PATENT DOCUMENTS

| | | |
|---|---|---|
| JP | 2006138526 | 6/2006 |
| WO | 03093729 | 11/2003 |

OTHER PUBLICATIONS

Advisory Action from U.S. Appl. No. 12/195,348 dated Jul. 31, 2012.

Applicant Initiated Interview Summary from U.S. Appl. No. 12/195,348 dated Jul. 1, 2013.

Examiner Initiated Interview Summary from U.S. Appl. No. 12/195,348 dated Oct. 9, 2013.

Final Office Action for U.S. Appl. No. 12/195,348 dated Sep. 28, 2011 (3982.003).

Final Office Action from U.S. Appl. No. 12/195,348 dated Jun. 5, 2012.

International Search Report and Written Opinion of the International Searching Authority for PCTUS2009052014 dated Feb. 18, 2010 (3982.003PC).

Interview Summary for U.S. Appl. No. 12/195,348 dated Dec. 2, 2011 (3982.003).

Interview Summary for U.S. Appl. No. 12/195,348 dated May 21, 2012.

Non Final Office Action for U.S. Appl. No. 12/195,348 dated Jun. 9, 2011 (3982.003).

Non Final Office Action for U.S. Appl. No. 12/195,348 dated Feb. 15, 2012.

Non Final Office Action from U.S. Appl. No. 12/195,348 dated Mar. 27, 2013.

Notice of Allowance for U.S. Appl. No. 12/195,348 dated Oct. 9, 2013.

U.S. Appl. No. 14/158,750, filed Jan. 17, 2014.
U.S. Appl. No. 15/702,252, filed Sep. 12, 2017.
U.S. Appl. No. 12/195,348, filed Aug. 20, 2008.
U.S. Appl. No. 15/660,845, filed Jul. 26, 2017.

USPTO; Applicant Initiated Inteview Summary issued in U.S. Appl. No. 14/158,750 dated Mar. 28, 2017.

USPTO; Final Office Action issued in U.S. Appl. No. 14/158,750 dated Dec. 23, 2016.

USPTO; Non-Final Office Action issued in U.S. Appl. No. 15/702,252 dated Apr. 3, 3019.

USPTO; Non-Final Office Action issued in U.S. Appl. No. 14/158,750 dated Aug. 17, 2016.

USPTO; Non-Final Office Action issued in U.S. Appl. No. 15/660,845 dated Oct. 18, 2017.

USPTO; Notice of Allowance issued in U.S. Appl. No. 14/158,750 dated Apr. 11, 2017.

USPTO; Notice of Allowance issued in U.S. Appl. No. 15/660,845 dated Dec. 4, 2017.

(56) References Cited

OTHER PUBLICATIONS

USPTO; Notice of Allowance issued in U.S. Appl. No. 15/702,252 dated Aug. 9, 2019.
USPTO; Restriction Requirement issued in U.S. Appl. No. 14/158,750 dated May 27, 2016.

\* cited by examiner

Portable Biometric Lighter
Frontal Perspective View

Portable Biometric Lighter - Partial Exploded View

Portable Biometric Lighter
Cross-Sectional View

PORTABLE BIOMETRIC LIGHTER

This application is a continuation of U.S. application Ser. No. 15/702,252, filed Sep. 12, 2017, for PORTABLE BIOMETRIC LIGHTER, which is incorporated in its entirety herein by reference.

TECHNICAL FIELD

The present invention generally technically relates to portable biometric lighter devices, and more specifically, to portable lighters using biometric data to prevent unauthorized usage. The present invention technically relates to devices ensuring that a user of a portable lighter is an authorized user and that a minor will not be able to activate the portable lighter.

BACKGROUND ART

Portable lighters are commonly used for lighting cigarettes, tobacco pipes, cigars, charcoal grills, pilots of gas appliances, fireplaces, water-heaters, and campfires. These portable lighters are typically activated by a user opening a cap, manually flicking a wheel to create a spark, and depressing a button that allows lighter fluid to flow. Unfortunately, these typical portable lighters have no safety mechanism to prevent an unauthorized user, such as a child, from activating a flame and accidently causing fire and bodily injuries, or other unauthorized users from intentionally causing fires. While some portable lighters have incorporated safety precaution mechanisms to deal with the possibility of misuse of a portable lighter, such examples include a portable lighter that incorporates a gas valve button that will not allow lighter fluid to flow unless a force of an adult finger is applied to the gas valve button, and a portable lighter that incorporates an electronic alphanumeric keypad to control access to the portable lighter's ignition mechanisms. These examples, however, have their shortcomings in that they are not user-friendly for the authorized user and the safety mechanisms that are in place can easily be tampered by a child.

With respect to the portable lighter that incorporates a gas valve button, requiring the force of an adult's finger, an authorized adult user may not always be able to apply the force necessary to activate the button or an older aged child may have the ability to apply a force that mimics that of an adult. With respect to the alphanumeric keypad and requiring a security code to activate the lighter, an authorized user may forget the security code or a child can gain access to the code by merely viewing the authorized user enter the security code.

Thus, a long-felt need exists in the art for a portable lighter that is able to easily recognize the authorized user of the portable lighter and that is able to prevent an unauthorized user, e.g., a child, from mimicking the authorized user. The incorporation of a biometric sensor and biometric data, such as a fingerprint sensor and a fingerprint data, satisfies the aforementioned needs.

SUMMARY OF THE INVENTION

In one embodiment, the present invention involves as a portable biometric lighter device, comprising: a control unit; a biometric sensor, wherein the biometric sensor is configured to scan a biometric data of a user and is operably coupled to the control unit; and an ignition element, wherein the ignition element is activated by the control unit upon a match of the scanned biometric data of the user and a biometric data of an authorized user that is stored in a memory device. While the present invention focuses on portable biometric lighter devices, it is not limited to portable biometric lighter devices, as it can be applied to countless other portable flammable devices and systems that require safety precautions. In addition, while the present invention comprises a fingerprint sensor as the biometric sensor and a fingerprint as the biometric data, by example only, other types of biometric sensors and other types of biometric data can be incorporated, such as a voice sensor and voice data, an age detector and an age data, or a facial image sensor and a facial image data. The present invention also involves a method of fabrication of the portable biometric device.

In another embodiment, the invention can be characterized as a method for controlling access to a portable biometric lighter device, comprising the steps of: scanning a biometric data from an authorized user; storing in a memory device the biometric data from the authorized user; scanning a biometric data from a user; determining a match between the scanned biometric data from the authorized user and the scanned biometric data from the user; and activating the portable biometric lighter device upon the match between the scanned biometric data from the authorized user and the scanned biometric data from the user.

In yet another embodiment, the invention involves a portable biometric lighter device, comprising a device for scanning a biometric data from an authorized user; a device for scanning a biometric data from a user; and a device for activating the portable biometric lighter device upon a match of the biometric data from the authorized user and the biometric data from the user.

In some embodiments, a portable biometric lighter device, comprises a control unit operably coupled to an igniter. The igniter is coupled to a flammable power source ignitable upon operation of the igniter. The lighter further comprises a memory device coupled to the control unit and configured to store biometric data including at least one fingerprint of at least one authorized user, and a push-button including a biometric sensor, the movable cap configured to move between a deactivated position and an activated position and to activate the biometric sensor and a gas lever when the movable cap is moved toward the activated position. The biometric sensor is operably connected to the control unit and configured to scan a fingerprint of a user. The lighter further comprises a light source configured to provide status of the biometric sensor and to indicate, to the user, that the biometric sensor is ready to scan biometric data of the user and an igniter operably coupled to the control unit and configured to ignite the flammable power source to produce a flame in response to being activated by the control unit upon a determination by the control unit that the fingerprint of the user scanned by the biometric sensor matches the biometric data of the authorized user stored in a memory device.

In some embodiments, a method for lighting a portable biometric lighter device comprise: providing a control unit operably coupled to an igniter, the igniter coupled to a flammable power source ignitable upon operation of the igniter; providing a memory device coupled to the control unit storing biometric data including at least one fingerprint of at least one authorized user; providing a push-button including a biometric sensor, the movable cap configured to move between a deactivated position and an activated position and to activate the biometric sensor and a gas lever when the movable cap is moved toward the activated position, the biometric sensor being operably connected to the control unit and configured to scan a fingerprint of a user; providing a light source configured to provide status of the biometric sensor and to indicate, to the user, that the biometric sensor is ready to scan biometric data of the user; providing an igniter operably coupled to the control unit and configured to ignite the flammable power source to produce a flame in response to being activated by the control unit; scanning biometric data of the user via the biometric sensor activated after the push-button is moved to the activated position; determining, via the control unit that the fingerprint of the user scanned by the biometric sensor matches the biometric data of the authorized user stored in a memory device; and activating, via the control unit, the igniter in order to ignite the flammable power source via the activated igniter.

In some embodiments, a portable biometric lighter device, comprises a control unit operably coupled to an igniter. The igniter is coupled to a flammable power source wherein the flammable power source is ignited upon operation of the igniter. The lighter further includes a memory device storing biometric data including at least one fingerprint of at least one authorized user and a body having a cover and including a biometric sensor. The cover is configured to move between a closed position and an open position and to activate the biometric sensor and a gas lever when the movable cover is moved toward the open position. The biometric sensor is operably connected to the control unit and configured to scan a fingerprint of a user. The lighter further includes a light source configured to provide status of the biometric sensor and to indicate, to the user, that the biometric sensor is ready to scan biometric data of the user and an igniter operably coupled to the control unit and configured to ignite the flammable power source to produce a flame in response to being activated by the control unit upon a determination by the control unit that the fingerprint of the user scanned by the biometric sensor matches the biometric data of the authorized user stored in a memory device.

In some embodiments, the method for lighting a portable biometric lighter device includes: providing a control unit operably coupled to an igniter, the igniter coupled to a flammable power source wherein the flammable power source is ignited upon operation of the igniter; providing a memory device storing biometric data including at least one fingerprint of at least one authorized user; providing a body having a cover and including a biometric sensor, the cover configured to move between a closed position and an open position and to activate the biometric sensor and a gas lever when the movable cover is moved toward the open position, the biometric sensor being operably connected to the control unit and configured to scan a fingerprint of a user; providing a light source configured to provide status of the biometric sensor and to indicate, to the user, that the biometric sensor is ready to scan biometric data of the user; providing an igniter operably coupled to the control unit and configured to ignite the flammable power source to produce a flame in response to being activated by the control unit; scanning biometric data of the user via the biometric sensor activated after the cover is moved to the open position; determining, via the control unit that the fingerprint of the user scanned by the biometric sensor matches the biometric data of the authorized user stored in a memory device; and activating, via the control unit, the igniter in order to ignite the flammable power source via the activated igniter.

Advantages of the present invention include, but are not limited to, providing enhanced safety to incendiary devices, decreasing the probability of accidental fire or arson, decreasing the probability of personal injury, decreasing the probability of property damage, and decreasing the cost of fire insurance. Other features of the present invention are disclosed, or are apparent, in the section entitled "Mode(s) for Carrying-Out the Invention," disclosed, infra.

BRIEF DESCRIPTION OF THE DRAWINGS

For a better understanding of the present invention, reference is made to the below-referenced accompanying Drawing(s). Reference numbers refer to the same or equivalent parts of the present invention throughout the several figures of the Drawing(s).

MODE(S) FOR CARRYING-OUT THE INVENTION

Figure 1:
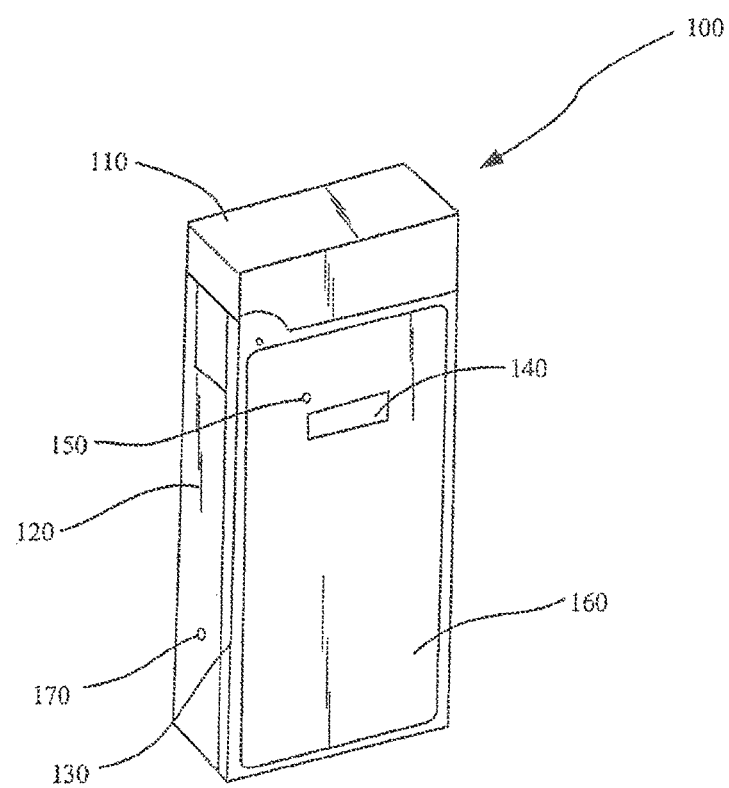
FIG. 1 is a frontal perspective view of a portable biometric lighter, showing a cap, a body, a body cover, a fingerprint sensor, a light emitting diode (LED), a label, and a set switch, in accordance with the present invention.

Referring to FIG. 1, a front perspective view of a portable biometric lighter device 100 shows a cap 110, a body 120, a body cover 130, a fingerprint sensor 140, an LED 150, a label 160, and a set switch 170. The portable biometric lighter device 100 as shown in FIG. 1 is that of a cigarette/cigar lighter type, by example only. Other examples of alternative embodiments of the portable biometric lighter device 100, not shown, can be that of a utility lighter, a barbeque lighter, and an oil-lighter. The portable biometric lighter device 100 can be that of a disposable type, e.g., wherein the user disposes of the portable biometric lighter 100 once the lighter fluid or the power source is expended, or a reusable type, e.g., wherein the user can replace the power source and/or refill the lighter fluid. The lighter fluid may comprise at least one flammable component, such a butane gas, aliphatic hydrocarbon, a kerosene, a paraffinic hydrocarbon, a napthenic hydrocarbon, a benzene, a terpene, a terpenoid, a methanol, an ethanol, a propanol, a butanol, an aliphatic naptha, a hexamine, a lacolene, and the like.

The portable biometric lighter device 100, as shown, comprises a cap 110. The cap 110 is hingedly coupled to the body 120 and is configured to prevent accidental activation of both a gas valve lever (not shown) and an active switch (not shown). The cap 110 may also be configured to activate the fingerprint sensor 140 and allow lighter fluid (not shown) to flow when it is flipped open. The cap 110 is typically made of the same material as the body 120. While FIG. 1 shows the biometric lighter 100 with a cap 110, alternative embodiments may not comprise the cap 110.

The body 120, as shown in FIG. 1, is of a rectangular shape; however, alternative embodiments of the portable biometric lighter 100 may involve other shapes, such as a square shape, a circular shape, a cylindrical or tubular shape, or an oval shape. The body 120 comprises any material, such as a polymer, a plastic, a metal, a heat-resistant material, and a composite. The body 120 is configured to house at least one of the following elements: a lighter fluid (not shown), a set switch 170, a fingerprint sensor 140, an LED 150, a control unit (not shown), a plurality of control lines (not shown), a power source (not shown), and a lighter fluid valve (not shown). The body 120 comprises an aperture for providing access to the set switch 170.

The body cover 130 comprises the same shape as that of the body 120 of the portable biometric lighter device 100, and also typically comprises the same material as that of the body 120. The body cover 130 is configured to cover the aforementioned housed elements (not shown) in the body 130. The body cover 130 comprises apertures for access to a fingerprint sensor 140 and an LED 150.

A biometric sensor, e.g., the fingerprint sensor 140, is operably coupled to a control unit (not shown). The biometric sensor is housed in the body 120 and is configured to scan and optionally store, in a memory device (not shown), an authorized user's biometric data, e.g., an authorized user's fingerprint, and a user's biometric data, e.g., a user's fingerprint, through an aperture of the body cover 130.

The LED 150 is operably coupled to the control unit (not shown). In addition, the LED 150 is configured to provide indications to a user, via blinking and/or indicating a color, such indications including the status of the portable biometric lighter functions, e.g., setup/teaching mode, low battery, failed scan, and incorrect match, by example only.

The label 160 is adhesively attached to the body cover 130. The label 160 comprises apertures for the fingerprint sensor 140 and the LED 150. The label 160 is configured to allow a manufacturer to place design features (not shown) or brand indicators (not shown), by example only. The label 160 further comprises apertures for accommodating a fingerprint sensor 140 and an LED 150.

The set switch 170 is operably connected to the control unit (not shown) and is housed in the body 120. Accessing the set switch 170 is performed through at least one aperture of the body 120. The set switch 170 is configured to activate the control unit (not shown) for accepting a new fingerprint, and to optionally erase a prior fingerprint from a memory device (not shown) if the control unit (not shown) is configured to allow erasing prior fingerprint and accepting new fingerprint.

Figure 2:
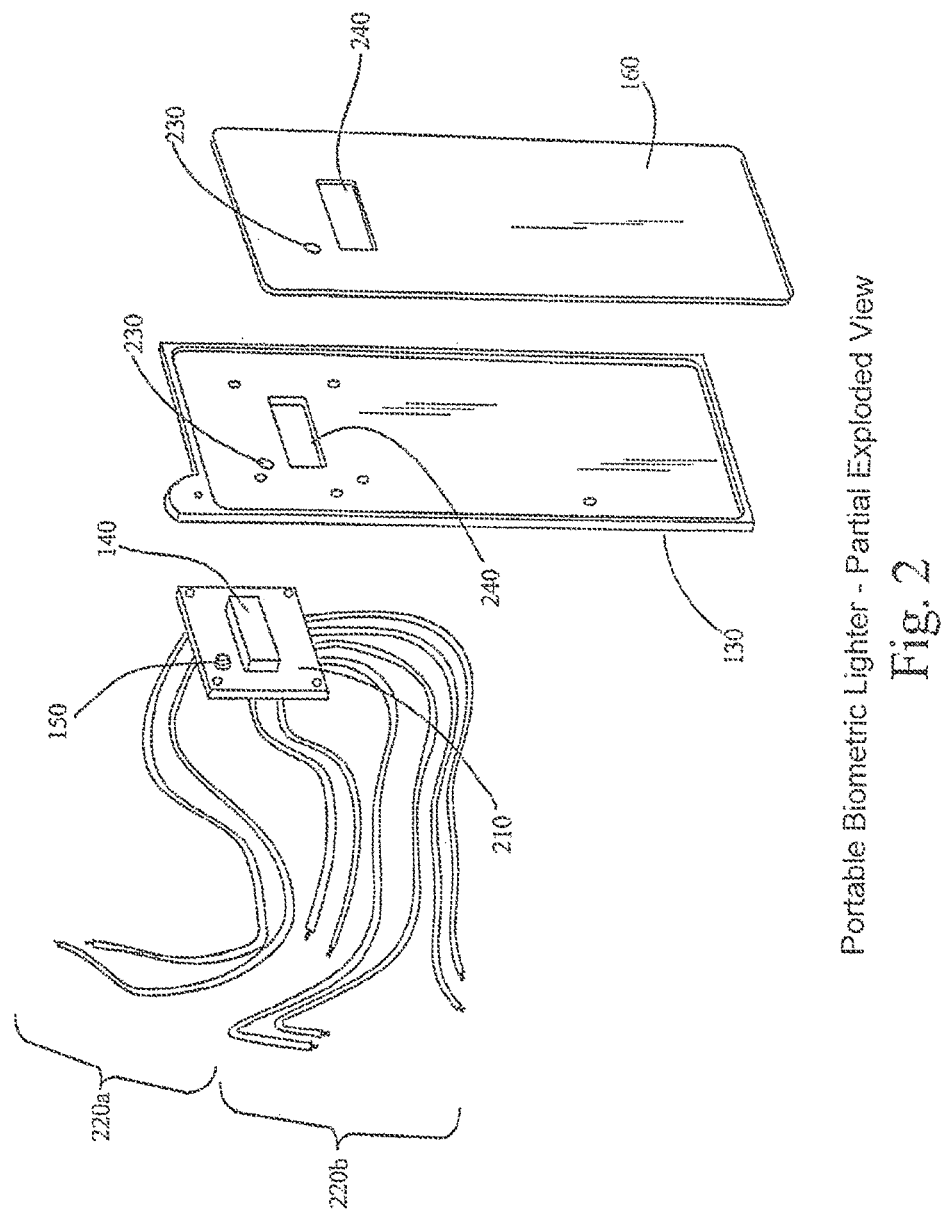
FIG. 2 is a partial exploded view of the portable biometric lighter, in accordance with the embodiment of FIG. 1, showing a label, a body cover, a fingerprint sensor, an LED, a control unit, a plurality of power lines and control lines, a plurality of LED apertures, and a plurality of fingerprint sensor apertures.

Referring to FIG. 2, a partial exploded view of the portable biometric lighter device 100 is shown, in accordance with the embodiment of FIG. 1, the device 100 comprising a label 160, a body cover 130, a biometric sensor, e.g., a fingerprint sensor 140, an LED 150, a control unit 210, a plurality of power lines 220a and control lines 220b, a plurality of LED apertures 230, and a plurality of fingerprint sensor apertures 240.

Figure 3:
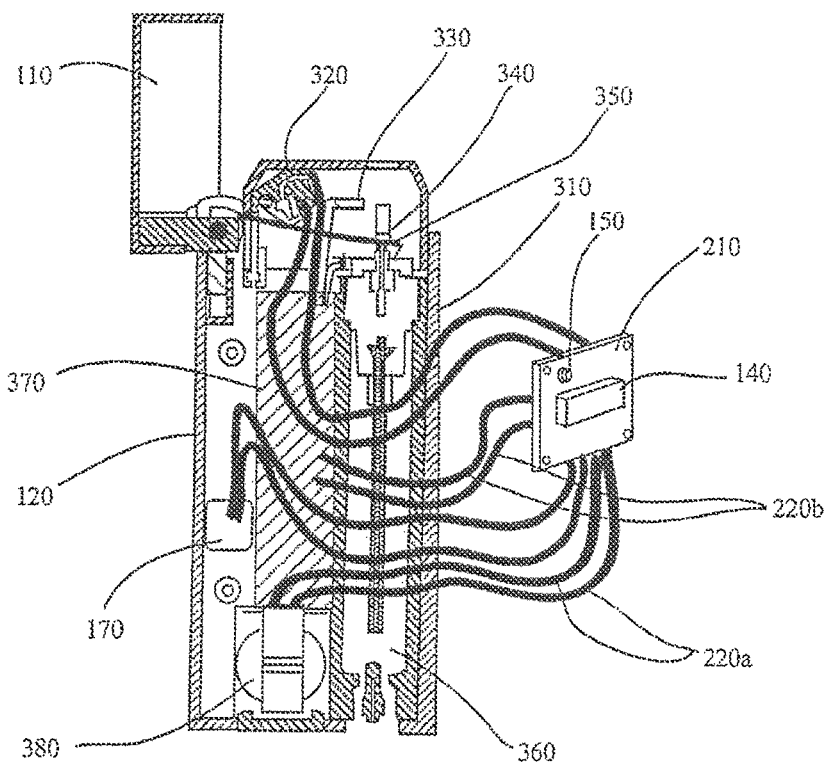
FIG. 3 is a cross-sectional view of the portable biometric lighter, in accordance with the embodiment of FIG. 1, showing a cap, a body, a fingerprint sensor, an LED, a control unit, a plurality of power lines, a plurality of control lines, a set switch, a gas lever, an active switch, a lighter fluid valve, a nozzle, a pulse igniter, a pole, a lighter fluid, and a power source.

Referring to FIG. 3, a cross-sectional view of the portable biometric lighter device 100 is illustrated, in accordance with the embodiment of FIG. 1. The device 100 comprises a cap 110, a body 120, a biometric sensor, e.g., a fingerprint sensor 140, an LED 150, a control unit 210, a plurality of power lines 220a, a plurality of control lines 220b, a set switch 170, a gas lever 350, an active switch 320, a lighter fluid valve 310, a nozzle 340, a pulse igniter 370, a pole 330, a lighter fluid 360, and a power source 380. Alternatively, an electric gas valve (not shown) may be used in place of the cap 110.

A power source 380 is operably coupled to a control unit 210 and is housed within a body 120. The power source 380 can be a primary cell battery, a rechargeable battery, or a photo-voltaic cell, by example only. The power source 380 provides power to the control unit 210 and/or the fingerprint sensor 140 via a plurality of power lines 220a.

The active switch 320 is operably coupled to the fingerprint sensor 140 such that upon a user flipping open the cap 110, the gas lever 350 is pulled up and activates the active switch 320 via contact force or electromagnetic force. The active switch 320 upon activation then activates the fingerprint sensor 140 to read or scan a fingerprint. The gas lever 350 is also configured to lift the nozzle 340, which allows the lighter fluid 360 to be released from the lighter fluid valve 310, upon the user flipping open the cap 110.

A pulse igniter 370, such as a piezoelectric based circuit, is configured to produce a high voltage spark from a pole 330 to the nozzle 340 upon the control unit 210 determining a match between a scanned user's biometric data, such as the user's fingerprint and the authorized user's biometric data, e.g., authorized user's fingerprint, that is previously stored in a memory device (not shown). A flame is subsequently produced when the high voltage sparks come in contact with the lighter fluid 360 that is flowing through the lighter fluid valve 310 to the nozzle 340.

Figure 4:
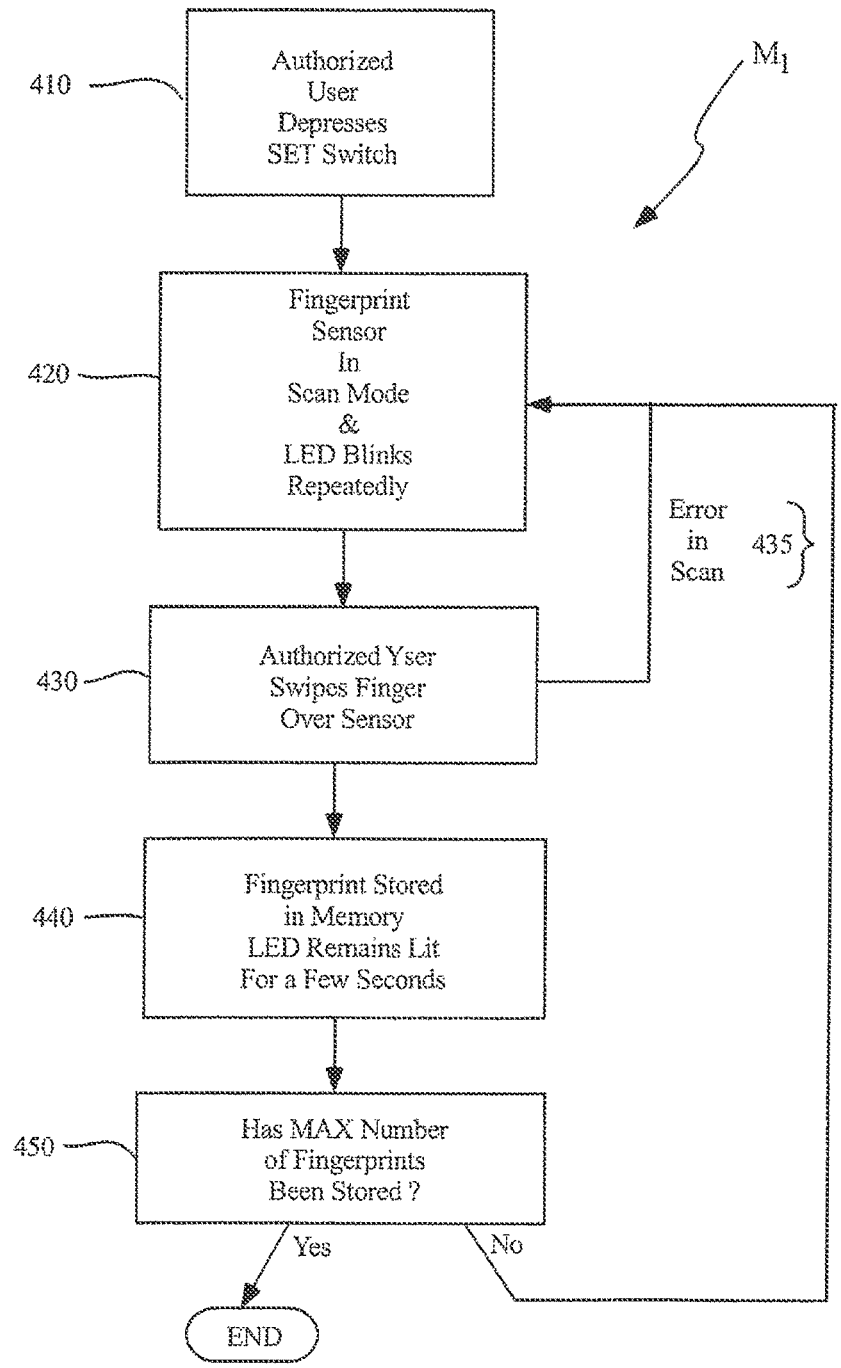
FIG. 4 is a flowchart showing the steps of a method of teaching an authorized user's fingerprint to the portable biometric lighter, in accordance with the embodiment of FIG. 1.

Referring to FIG. 4, a flowchart illustrates the steps of a method $M_1$ of setting-up/teaching an authorized user's biometric data, e.g., fingerprint, to the portable biometric lighter device 100, by way of a biometric lighter device 100, in accordance with the embodiment of FIG. 1. The first teaching step 410 comprises the step of an authorized user depressing a set switch 170. The second teaching step 420 comprises commencing periodic or repetitious blinking by an LED 150 to indicate that the fingerprint sensor 140 is ready to scan. The third teaching step 430 comprises the step of an authorized user swiping or depressing his or her finger, preferably the thumb or the index finger, over the fingerprint sensor 140. If an error in scanning the fingerprint occurs, the LED 150 continues to blink repeatedly as indicated by method step block 435. The fourth teaching step 440 comprises the fingerprint sensor 140 successfully scanning and storing fingerprint data in a memory device, wherein the LED 150 remains lit for a brief interval before extinguishing. According to block 450, this process of teaching may be repeated until a manufacturer pre-determined maximum number of fingerprints is stored, e.g., 4 fingerprints. In this embodiment, the stored fingerprints are not erasable or changeable.

Figure 5:
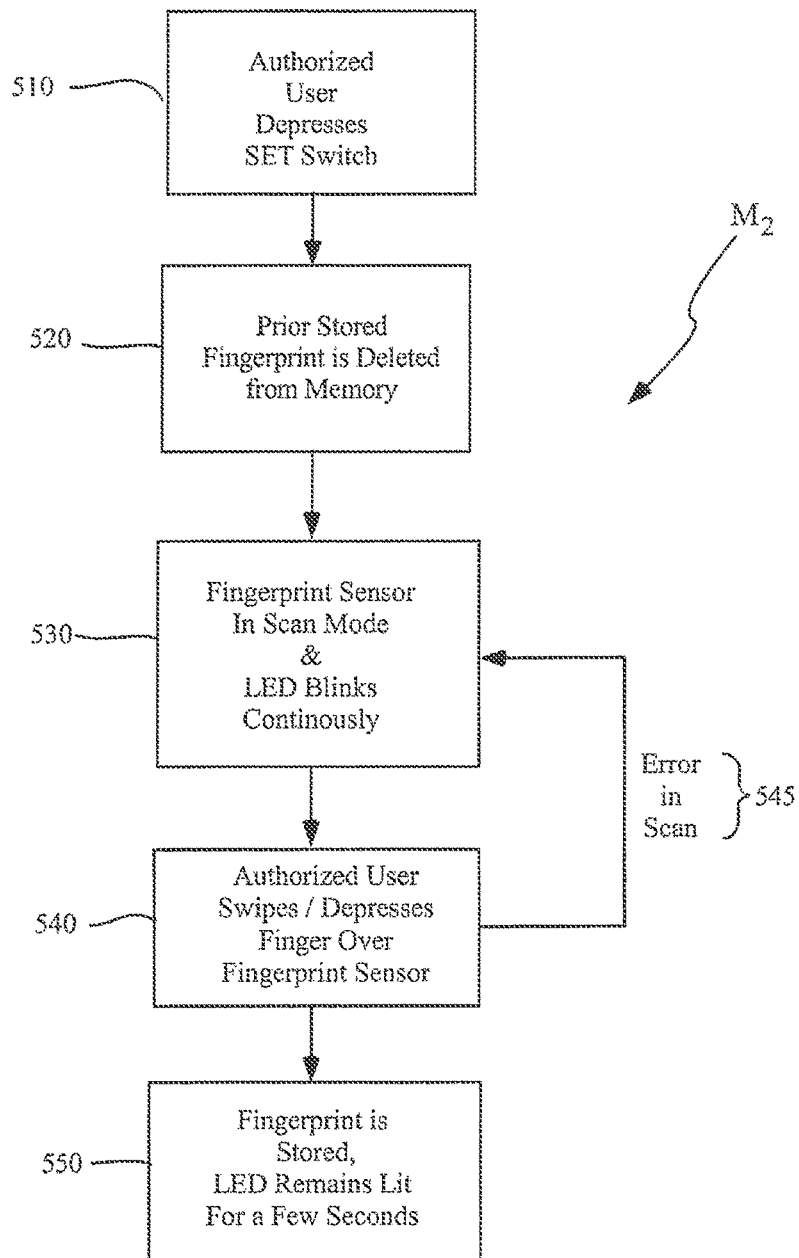
FIG. 5 is a flowchart showing the steps of an alternative method of teaching an authorized user's fingerprint to the portable biometric lighter, in accordance with the embodiment of FIG. 1, wherein a prior fingerprint that is stored in a memory device is cleared upon the teaching of a new authorized user's fingerprint.

Referring to FIG. 5, a flowchart shows the steps of an alternative method $M_2$ of teaching an authorized user's fingerprint to the portable biometric lighter device 100, in accordance with the embodiment of FIG. 1, wherein prior fingerprint that being stored in a memory device is erased upon teaching of a new authorized user's fingerprint.

The first alternative teaching step 510 in the method $M_2$ involves an authorized user depressing/activating a set switch 170. Then the second alternative teaching step 520 comprises deleting prior stored fingerprint data of an authorized user from a memory device (not shown). The third alternative teaching step 530 comprises commencing periodic or repetitious blinking by an LED 150 to indicate that the fingerprint sensor 140 is ready to scan in new authorized user's biometric data, e.g., a fingerprint. The fourth alternative teaching step 540 comprises swiping by an authorized user's finger, preferably the thumb or the index finger, over the fingerprint sensor 140. If an error occurs in scanning the fingerprint, the LED 150 continues to blink repeatedly as indicated by method step 545. The fifth alternative teaching step 550 comprises successfully scanning and storing a fingerprint scan in a memory device (not shown) by the fingerprint sensor 140, wherein the LED 150 remains lit for a brief interval before extinguishing.

Figure 6:
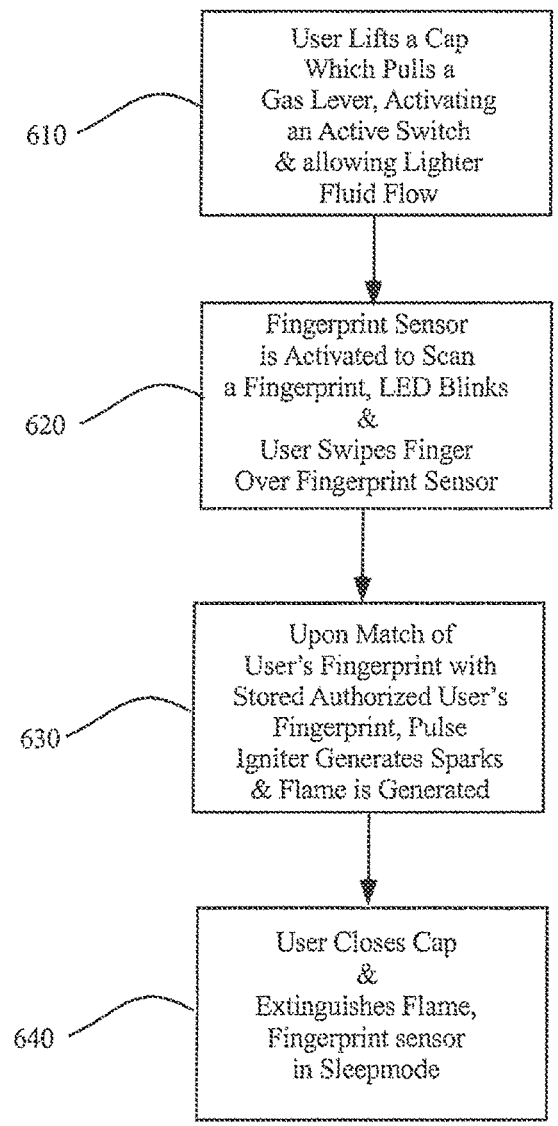
FIG. 6 is a flowchart showing the steps of igniting a flame for the portable biometric lighter, in accordance with the embodiment of FIG. 1.

Referring to FIG. 6, a flowchart illustrates the steps of activating, e.g., igniting a flame, by the portable biometric lighter device 100, in accordance with the embodiment of FIG. 1. The first step of igniting a flame 610 comprises a user opening a cap 110, whereby a gas lever 350 is actuated, thereby actuating an active switch 320 via contact pressure or electromagnetic force. The actuation of the gas lever 350 also simultaneously causes a lifting of a nozzle 340, which allows the lighter fluid 360 to be released from the lighter fluid valve 310.

The second step 620 of igniting a flame comprises the active switch 320, activating, via a control unit 210, the fingerprint sensor 140 to read or to scan a fingerprint and to repeatedly blink an LED 150 indicating to the user that the fingerprint sensor 140 is in "scan" or "read" mode. The third step 630 of igniting the flame comprises the control unit 210 determining that the scanned fingerprint matches an authorized user's fingerprint that is stored in memory. If the scanned fingerprint matches an authorized user's fingerprint that is stored in memory, the control unit 210 will activate a pulse igniter 370, e.g., a piezoelectric based circuit, thereby generating a plurality of high voltage sparks through the pole 330 to the nozzle 340. A flame is thereby generated via lighter fluid 360 flowing through the nozzle 340. However, if the scanned fingerprint does not match an authorized user's fingerprint that is stored in memory, the LED 150 will blink in a red color and then subsequently in a green color as the fingerprint sensor 140 continues to read or scan a fingerprint.

While the embodiment in FIG. 6 involves the control unit 210 activating a pulse igniter 370 upon a fingerprint match, alternative embodiments may also involve the control unit 210 deactivating, via a solenoid and at least one of the following elements: a push button (not shown), a cap lock (not shown), the cap lock being releasable, a gas valve lock (not shown), an electric gas valve (not shown), the electric gas valve being switchable to an "on" position. The fourth step 640 of igniting a flame comprises the user closing the cap 110, thereby extinguishing the flame and the control unit 210 deactivating the fingerprint sensor, e.g., sleep mode.

Figure 7:
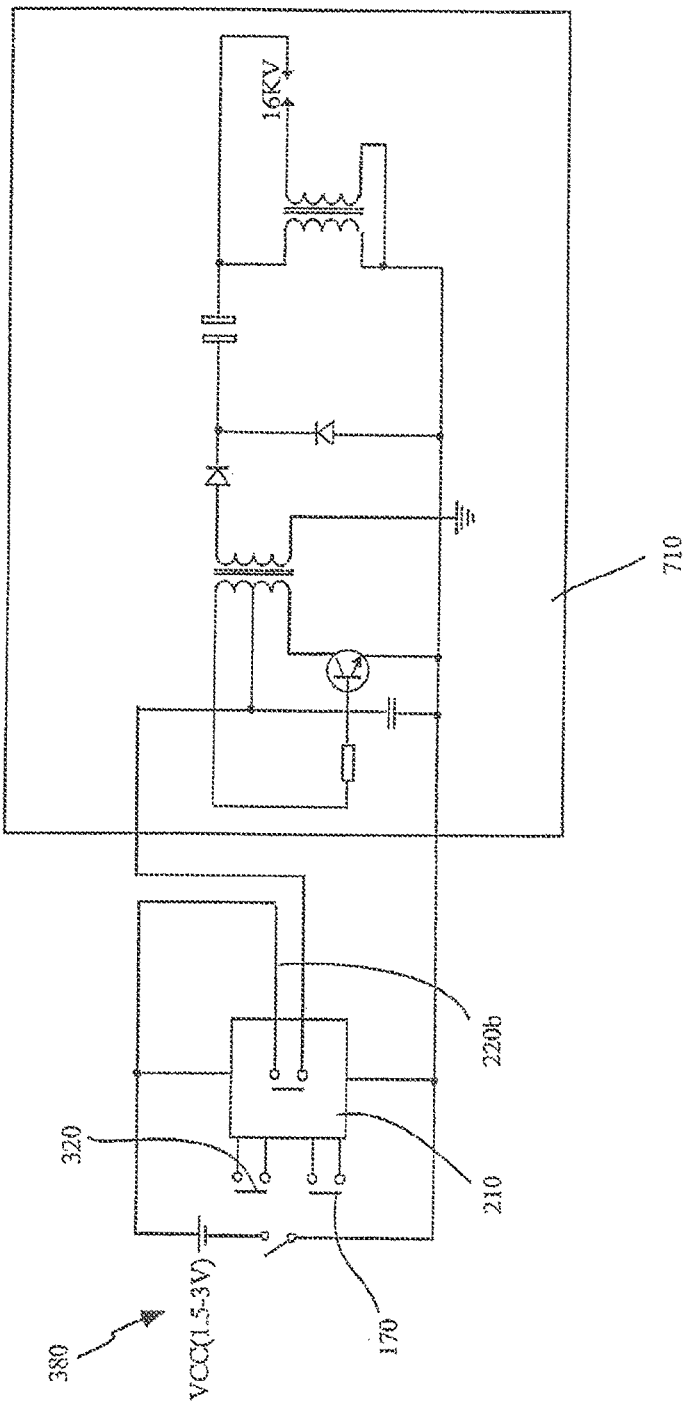
FIG. 7 is a circuit diagram of the portable biometric lighter, in accordance with the embodiment of FIG. 1, showing a control unit, a power source, a control line, a set switch, an exemplary pulse igniter circuit, and an active switch.

Referring to FIG. 7, a circuit diagram of the portable biometric lighter device 100 is shown, in accordance with the embodiment of FIG. 1. The portable biometric lighter device 100 comprises a control unit 210, a power source 380, a control line 220b, a set switch 170, an exemplary pulse igniter circuit 710, and an active switch 320. The power source 380 continuously provides power to the control unit 210.

Figure 8:
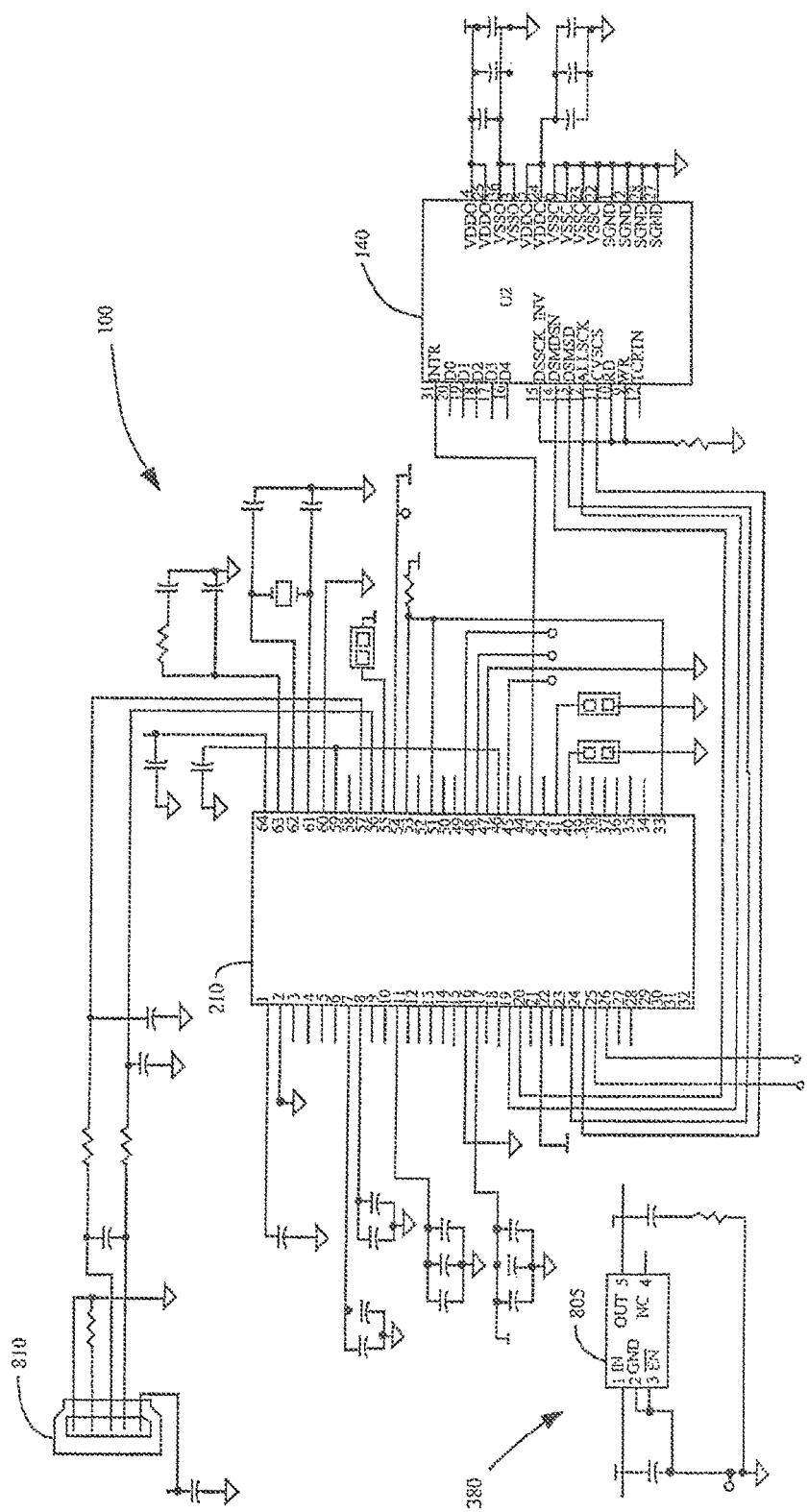
FIG. 8 is an alternative circuit diagram of the portable biometric lighter, in accordance with the embodiment of FIG. 1.

Referring to FIG. 8, an alternative circuit diagram of the portable biometric lighter device 100 is illustrated, in accordance with the embodiment of FIG. 1. In particular, device 100 is shown having control unit 210 coupled to fingerprint sensor 140. In the depicted embodiment, control unit 210 may be implemented using a microcontroller such as the ARM thumb-based microcontroller Model No. AT91SAM7S256, available from ARM, Inc., of Austin Tex. In addition, the fingerprint sensor 140 is shown implemented using the ATW210 fingerprint sensor available from Atrua Technologies, Inc., of Campbell Calif. FIG. 8 also shows USB port 810 coupled to leads 56 and 57 of control unit 210.

Power source 380 is shown providing power to voltage regulator 805. The voltage regulator is shown implemented using the TPS76933 voltage regulator provided by Texas Instruments of Dallas, Tex. It is understood that during operation of voltage regulator 805, a reference voltage of 1.7V or greater on input 3 will disable the internal circuitry of the voltage regulator, thus significantly reducing the supply current via output 5. On the other hand, a voltage of less than 0.9 V on input 3 will enable the voltage regulator and will enable operation of the controlled devices (e.g., control unit 210 and fingerprint sensor 140). Accordingly, in the embodiment of FIG. 8, the power source 380 does not provide power to the control unit 210 and the fingerprint sensor 140 until a user flips open the cap 110 that activates the gas lever 350 and the active switch 320 or the user depresses the set switch 170.

Control unit 210 is shown with leads 1-33 along the left side of the control unit, and leads 34-64 continuing along the opposing side. Table 1 setout below includes a pinout of the leads implemented by control unit 210.

| | |
|---|---|
| 1 | ADVREF |
| 2 | GND |
| 3 | AD4 |
| 4 | AD5 |
| 5 | AD6 |
| 6 | AD7 |
| 7 | VDDIN |
| 8 | VDDOUT |
| 9 | PA17/PGMD5/AD0 |
| 10 | PA18/PGMD6/AD1 |
| 11 | PA21/PGMD9 |
| 12 | VDDCORE |
| 13 | PA19/PGMD7/AD2 |
| 14 | PA22/PGMD10 |
| 15 | PA23/PGMD11 |
| 16 | PA20/PGMD8/AD3 |
| 17 | GND |
| 18 | VDDIO |
| 19 | PA16/PGMD4 |
| 20 | PA15/PGMD3 |
| 21 | PA14/PGMD2 |
| 22 | PA13/PGMD1 |
| 23 | PA24/PGMD12 |
| 24 | VDDCORE |
| 25 | PA25/PGMD13 |
| 26 | PA26/PGMD14 |
| 27 | PA12/PGMD0 |
| 28 | PA11/PGMM3 |
| 29 | PA10/PGMM2 |
| 30 | PA9/PGMM1 |
| 31 | PA8/PGMM0 |
| 32 | PA7/PGMNVALID |
| 33 | TDI |
| 34 | PA6/PGMNOE |
| 35 | PA5/PGMRDY |
| 36 | PA4/PGMNCMD |
| 37 | PA27/PGMD15 |
| 38 | PA28 |
| 39 | NRST |
| 40 | TST |
| 41 | PA29 |
| 42 | PA30 |
| 43 | PA3 |
| 44 | PA2/PGMEN2 |
| 45 | VDDIO |
| 46 | GND |
| 47 | PA1/PGMEN1 |
| 48 | PA0/PGMEN0 |
| 49 | TDO |
| 50 | JTAGSEL |
| 51 | TMS |
| 52 | PA31 |
| 53 | TCK |
| 54 | VDDCORE |
| 55 | ERASE |
| 56 | DDM |
| 57 | DDP |
| 58 | VDDIO |
| 59 | VDDFLASH |
| 60 | GND |
| 61 | XOUT |
| 62 | XIN/PGMCK |
| 63 | PLLRC |
| 64 | VDDPLL |

Figure 9:
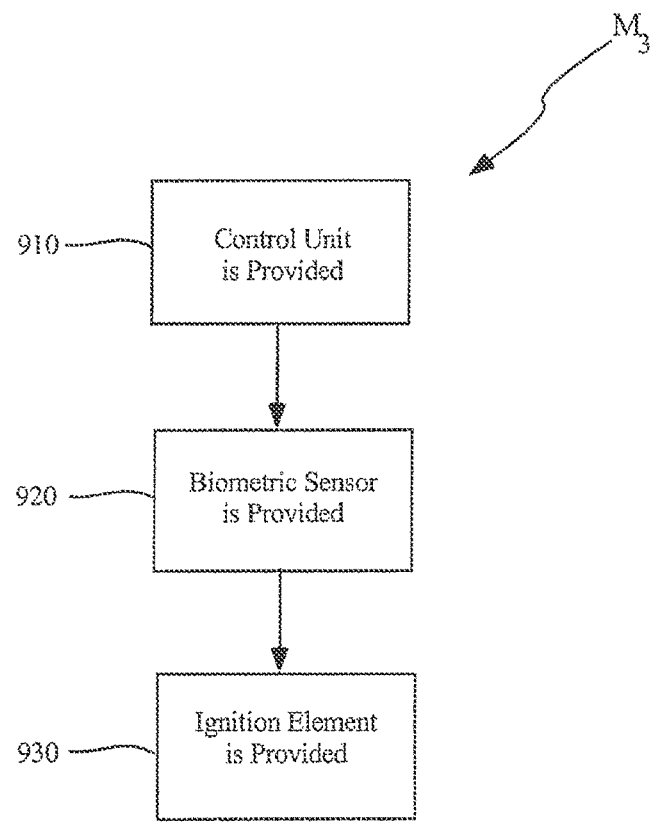
FIG. 9 is a flowchart showing a method of fabricating a portable biometric lighter.

Referring to FIG. 9, a method $M_3$ of fabricating a portable biometric lighter device 100 is shown, the method $M_3$ comprising the steps of: providing a control unit 210, as indicated by block 910; providing a biometric sensor, e.g., a fingerprint sensor 140, wherein the biometric sensor providing step comprises configuring the biometric sensor to scan biometric data of a user and operably coupling the biometric sensor to the control unit 210, as indicated by block 920; and providing an ignition element, wherein the ignition element providing step comprises rendering the ignition element activable by the control unit 210 upon a match of the scanned biometric data of the user and biometric data of an authorized user that is stored in a memory device, as indicated by block 930, wherein the biometric sensor providing step comprises providing a fingerprint sensor 140, wherein the biometric sensor providing step comprises providing biometric data, and wherein the biometric data providing step comprises providing a fingerprint, wherein the biometric data of the authorized user providing step comprises providing a fingerprint, and wherein the ignition element providing step comprises providing a piezoelectric pulse igniter.

Figure 10:
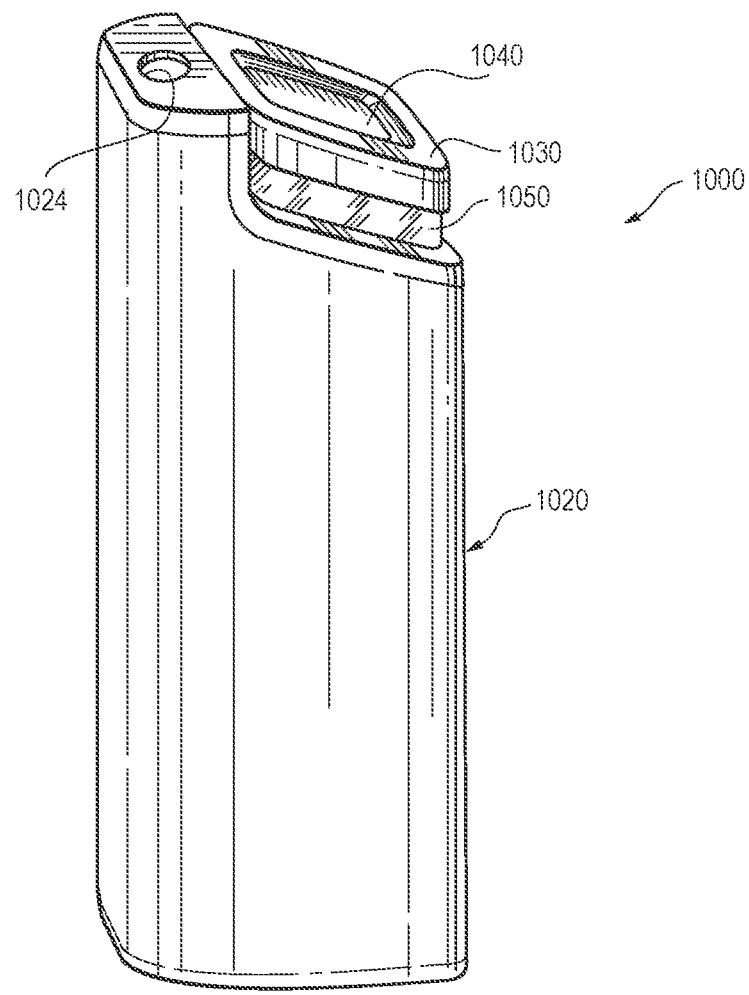
FIG. 10 is a side perspective view of a portable biometric lighter in accordance with some embodiments.
Figure 11:
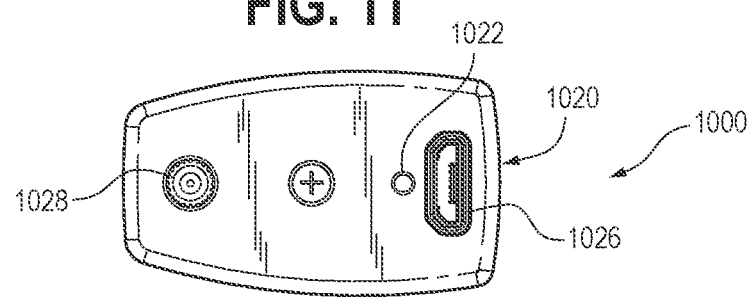
FIG. 11 is a bottom view of the portable biometric lighter of FIG. 10.

Referring to FIG. 10, a portable biometric lighter 1000 includes a body 1020, a fingerprint sensor 1040, and an LED 1050, and an opening 1024 for emitting a flame. The portable biometric lighter 1000 is shown in FIG. 10 as a cigarette/cigar lighter type, by way of example only, and it will be appreciated that the portable biometric lighter 1000 can be configured as a utility lighter, a barbeque lighter, and an oil-lighter. The portable biometric lighter 1000 can be disposable, e.g., wherein the user disposes of the portable biometric lighter 1000 after the lighter fluid or the power source is expended, or a reusable type, e.g., wherein the user can replace the power source and/or refill the lighter fluid. The lighter fluid may comprise at least one flammable component, such a butane gas, aliphatic hydrocarbon, a kerosene, a paraffinic hydrocarbon, a napthenic hydrocarbon, a benzene, a terpene, a terpenoid, a methanol, an ethanol, a propanol, a butanol, an aliphatic naptha, a hexamine, a lacolene, and the like.

In the embodiment illustrated in FIG. 10, the portable biometric lighter 1500 includes a push-button 1530. The push-button 1530 is movably coupled to the body 1520 such that the push-button 1530 can move (by being depressed or released by a user) between a deactivated position of FIG. 10 to an activated position of FIG. 12. In some embodiments, the push-button 1530 is configured to activate the fingerprint sensor 1540 and allow lighter fluid to flow when the push-button 1530 is depressed. The push-button 1530 may be made of the same material as the body 1520, or may be made of a different material.

Figure 12:
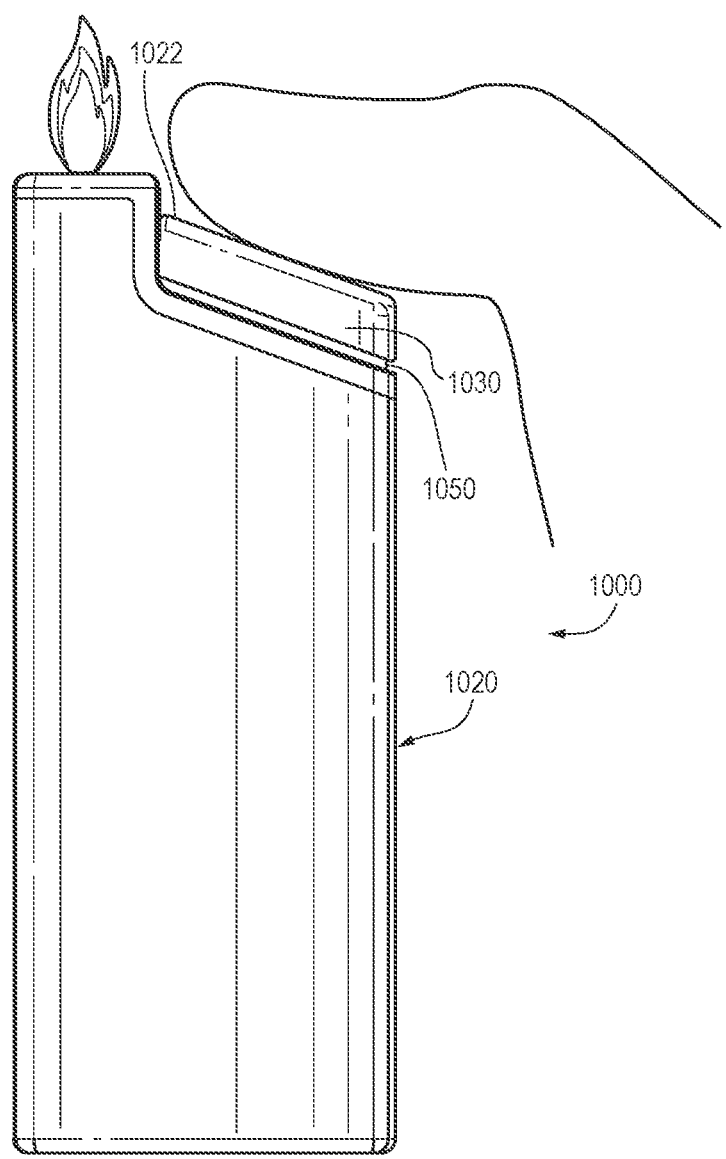
FIG. 12 is a side elevational view of the portable biometric lighter of FIG. 10 depicted in an activated condition and emitting a flame.
Figure 13:
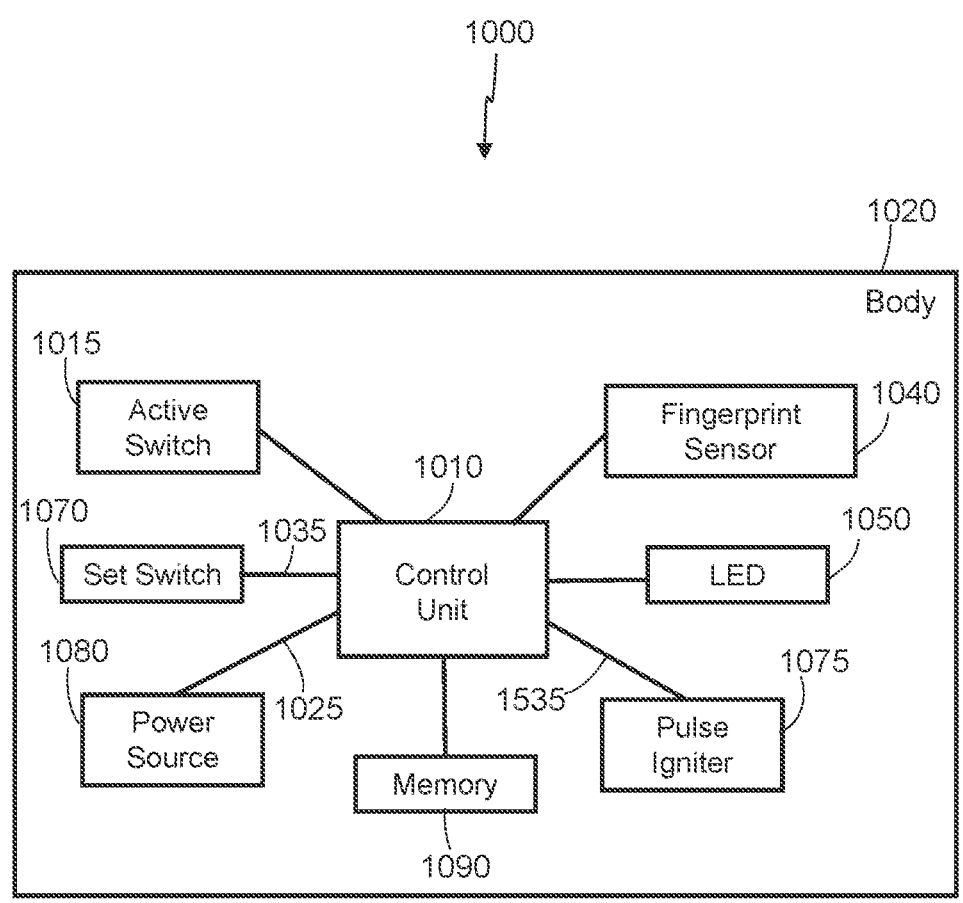
FIG. 13 is a functional block diagram illustrating the portable biometric lighter of FIG. 10 in accordance with some embodiments.

The body 1020 of the portable biometric lighter 1000 of FIG. 10 has a generally rectangular shape, but it will be appreciated that alternative embodiments of the portable biometric lighter 1000 may be of other shapes, for example, square, circular, cylindrical, tubular, oval, or the like. The body 1020 may be formed from any suitable material, for example, a polymer, a plastic, a metal, a heat-resistant material, a composite, or combinations thereof. With reference to FIGS. 10 and 13, in some embodiments, the body 1020 is configured to include one or more of the following elements: a fingerprint sensor 1040, an LED 1050, a control unit 1010, power lines 1025, control lines 1035, a set switch 1070, a gas lever (akin to the one shown in FIG. 3), an active switch 1015, a lighter fluid valve (akin to the one shown in FIG. 3), a nozzle (akin to the one shown in FIG. 3), a pulse igniter 1075, a pole (akin to the one shown in FIG. 3), a lighter fluid reservoir (akin to the one shown in FIG. 3), a power source 1080, and a memory 1090. As can be seen in FIG. 12, the body 1020 of the exemplary portable biometric lighter 1000 includes an aperture 1022 for providing access to the set switch 1070, an aperture 1026 for connecting a USB-based charger, and a turn-knob 1028 for adjusting the size of the flame emitted by the portable biometric lighter 1000.

In the exemplary embodiment illustrated in FIG. 13, the biometric (i.e., fingerprint) sensor 1040 of the portable biometric lighter 1000 is operably coupled to a control unit 1010. The biometric sensor 1040 is housed at least partially within the body 1520 but includes an exterior-facing fingerprint reading surface located at a top surface of the push-button 1030 that is accessible by a user and that is configured to scan an authorized user's biometric data (e.g., fingerprint) and any other user's biometric data (e.g., fingerprint), which may be stored in the memory 1090 of the portable biometric lighter 1000.

The LED 1050 of the portable biometric lighter 1000 is operably coupled to the control unit 1010 and is configured to provide indications to a user, via blinking and/or solid color or colors, the status of the portable biometric lighter functions including but not limited to setup/teaching mode, low battery, failed scan, and incorrect match. For example, in some embodiments, when the portable biometric lighter 1000 is ready to read a user's fingerprint, the LED 1050 is illuminated in a blue color, when the user's scanned fingerprint matches an authorized user fingerprint stored in the memory 1090, the LED 1050 is illuminated in a green color, and when the user's scanned fingerprint does not match an authorized user fingerprint stored in the memory 1090, the LED 1050 is illuminated in a red color.

The set switch 1070 of the portable biometric lighter 1000 is operably connected to the control unit 1010 and is housed in the body 1020. In the embodiment illustrated in FIGS. 10 and 13, the set switch 1070 is accessible through an aperture 1022 of the body 1020. In some embodiments, the set switch 1070 is configured to activate the control unit 1010 for accepting a new fingerprint, and to optionally erase a prior fingerprint from the memory device 1090 of the portable biometric lighter 1000 if the control unit 1510 is configured to allow erasing a prior fingerprint and accepting a new fingerprint.

With reference to FIG. 13, a power source 1080 is operably coupled to the control unit 1010 and is housed within the body 1020. In some embodiments, the power source 1080 is a primary cell battery, a rechargeable battery, a photo-voltaic cell, or the like. In the embodiment illustrated in FIG. 13, the power source 1080 provides power to the control unit 1010 and/or the fingerprint sensor 1040 via the power lines 1025, but in some approaches, the power source 1080 may be operatively coupled to the control unit 1010 and/or to the fingerprint sensor 1040 via suitable alternative means.

In the embodiment illustrated in FIGS. 10-13, the active switch 1015 is operably coupled to the fingerprint sensor 1040 such that upon a user pressing down on the push-button 1030, the gas lever of the portable biometric lighter 1000 is actuated and activates the active switch 1015 via contact force or electromagnetic force. The active switch 1015 upon activation then activates the fingerprint sensor 1040 to read or scan a fingerprint. In some embodiments, upon the user depressing the push-button 1030, the gas lever of the portable biometric lighter 1000 is also configured to lift a nozzle of the portable biometric lighter 1000, which allows the lighter fluid to be released from the lighter fluid valve.

A pulse igniter 1070, such as a piezoelectric based circuit, is configured to produce a high voltage spark from a pole of the portable biometric lighter 1000 to the nozzle of the portable biometric lighter 1000 upon the control unit 1010 determining a match between the scanned biometric data (e.g., fingerprint) of a user and the biometric data (e.g., fingerprint) of an authorized user, which is stored in the memory 1090 of the portable biometric lighter 1000. A flame is subsequently produced when the high voltage sparks come in contact with the lighter fluid that is flowing through the lighter fluid valve to the nozzle.

Figure 14:
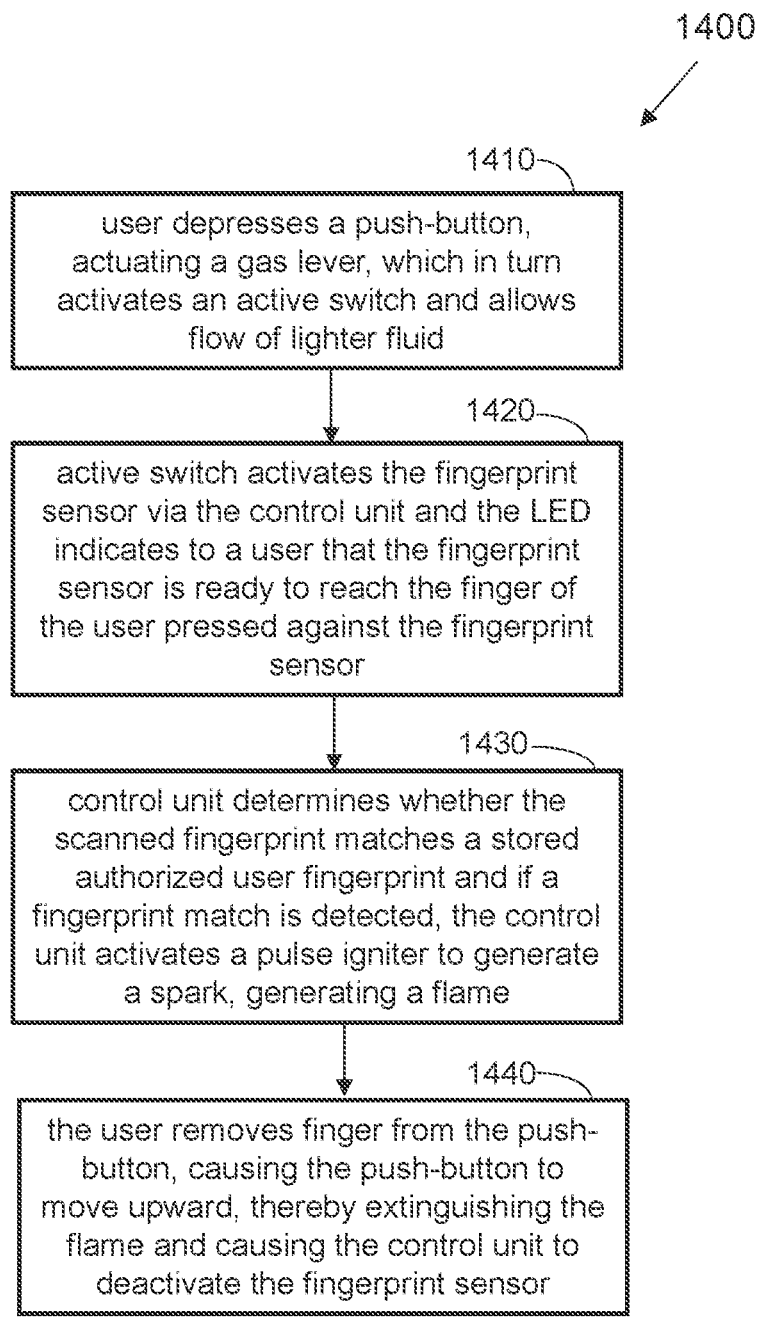
FIG. 14 is a flow chart diagram illustrating a method of igniting the portable biometric lighter of FIG. 10.

Referring to FIG. 14, a flowchart illustrates the steps of a method 1400 of activating, e.g., igniting a flame, by the portable biometric lighter 1000 depicted in FIGS. 10-13. The first step 1410 of the method 1400 of igniting a flame comprises a user placing a finger onto and depressing the push-button 1030, thereby actuating a gas lever, which in turn actuates an active switch 1015 via contact pressure or electromagnetic force. The actuation of the gas lever also causes a lifting of a nozzle, which allows lighter fluid to be released from the lighter fluid valve.

The second step 1420 of the method 1400 of igniting a flame comprises the active switch 1015, activating, via the control unit 1010, the fingerprint sensor 1040 to read or to scan a fingerprint and to indicate via the LED 1050 to the user that the fingerprint sensor 1040 is in "scan" or "read" mode. In the illustrated embodiment, the fingerprint sensor 1040 of the portable biometric lighter 1000 is located at an upper-facing surface of the push-button 1030, so while the user is depressing the push-button 1030, the user's thumb would be located on the fingerprint sensor 1040 enabling the fingerprint sensor 1040 to scan the user's thumb after the fingerprint sensor 1040 is activated.

The third step 1430 of the method 1400 of igniting the flame comprises the control unit 1010 determining whether the scanned fingerprint matches an authorized user's fingerprint that is stored in the memory 1090, and if the control unit 1010 determines that the scanned fingerprint matches an authorized user's fingerprint that is stored in the memory 1090, the control unit 1010 activates the pulse igniter 1070, e.g., a piezoelectric based circuit, thereby generating a plurality of high voltage sparks via the pole to the nozzle, thereby generating a flame via the lighter fluid flowing through the nozzle.

In some embodiments, when the control unit 1010 determines that the scanned fingerprint matches an authorized user's fingerprint that is stored in the memory 1090, the LED 1050 provides a color indication of a match (e.g., via a green color that is continuous or blinking). If, however, the control unit 1010 determines that the scanned fingerprint does not match an authorized user's fingerprint that is stored in memory, the LED 1050 will blink in a color (e.g., red) that indicates a mismatch or error, a flame is not emitted from the opening 1022 of the lighter 100, and the LED 1050 will revert to illuminating a color (e.g., blue) indicating the readiness of the fingerprint sensor 1040 to perform another scan of a user's finger.

With reference to FIG. 14, after the user has used the portable biometric lighter 1000 and wishes to deactivate the lighter 1000, the fourth step 1040 of the method 1000 of igniting a flame comprises the user removing his or her finger from the push-button 1030. This removal of the user's finger causes the push-button 1030 to move (due to an internal upward bias, for example, by a spring) from the activated position of FIG. 12 toward the deactivated position of FIG. 10, thereby extinguishing the flame and causing the control unit 1010 to deactivate the fingerprint sensor 1040 to place the fingerprint sensor 1540 in a sleep mode.

Figure 15:
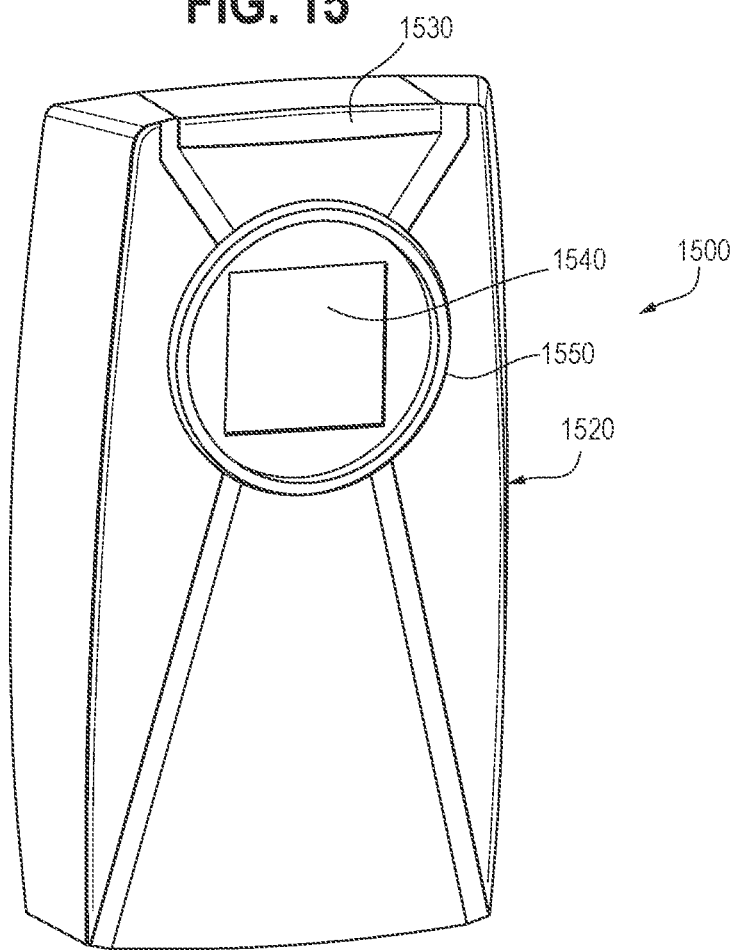
FIG. 15 is a front perspective view of a portable biometric lighter in accordance with some embodiments.

Referring to FIG. 15, a portable biometric lighter 1500 includes a cover 1530, a body 1520, a fingerprint sensor 1540, and an LED 1550. The portable biometric lighter 1500 is shown in FIG. 15 as a cigarette/cigar lighter type, by way of example only, and it will be appreciated that the portable biometric lighter 1500 can be configured as a utility lighter, a barbeque lighter, and an oil-lighter. The portable biometric lighter 1500 can be disposable, e.g., wherein the user disposes of the portable biometric lighter 1500 after the lighter fluid or the power source is expended, or a reusable type, e.g., wherein the user can replace the power source and/or refill the lighter fluid. The lighter fluid may comprise at least one flammable component, such a butane gas, aliphatic hydrocarbon, a kerosene, a paraffinic hydrocarbon, a napthenic hydrocarbon, a benzene, a terpene, a terpenoid, a methanol, an ethanol, a propanol, a butanol, an aliphatic naptha, a hexamine, a lacolene, and the like.

Figure 17:
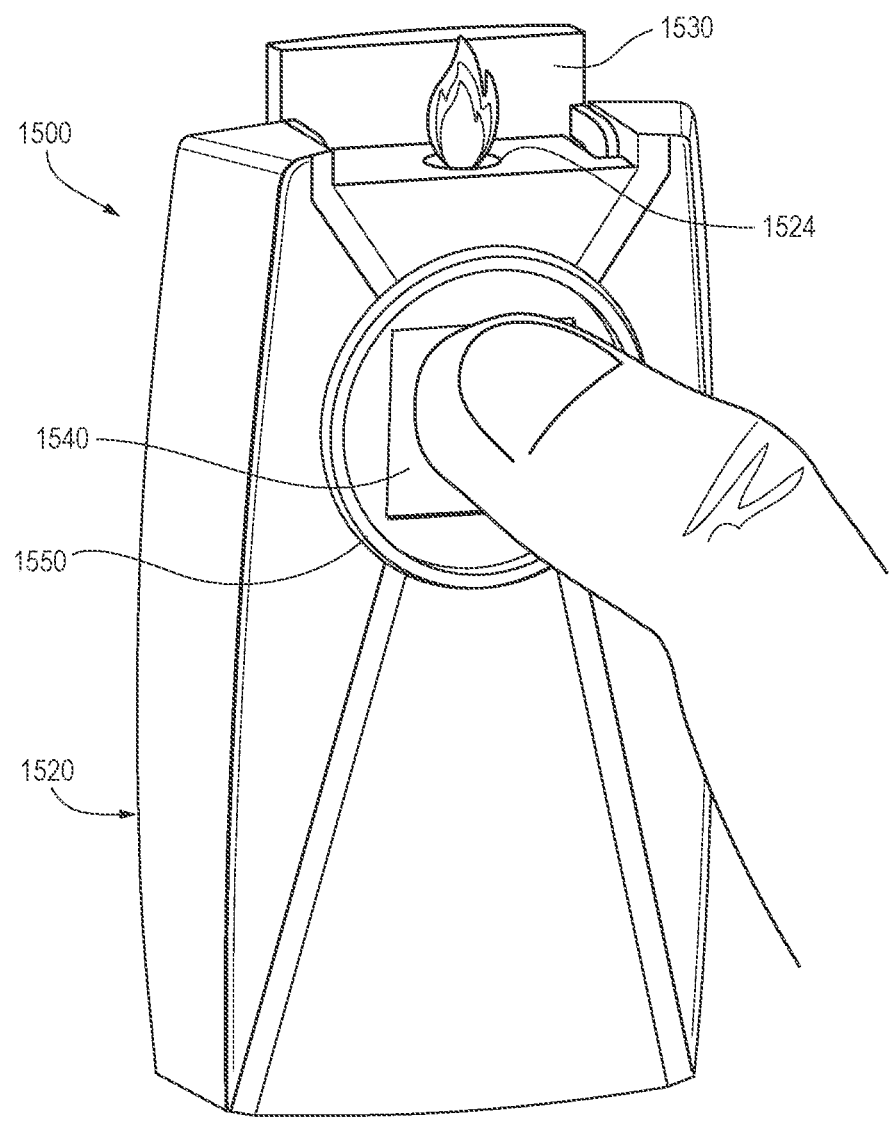
FIG. 17 is a front perspective view of the portable biometric lighter of FIG. 15 depicted in an activated condition and emitting a flame.

In the embodiment illustrated in FIG. 15, the portable biometric lighter 1500 includes a cover 1530. The cover 1530 is hingedly coupled to the body 1520 such that the cover 1530 can move from a closed position of FIG. 15 to an open position of FIG. 17, and is configured to prevent accidental activation of both a gas valve lever and an active switch of the portable biometric lighter 1500. In some embodiments, the cover 1530 is also configured to activate the fingerprint sensor 1540 and allow lighter fluid to flow when the cover 1530 is flipped open. The cover 1530 may be made of the same material as the body 1520, or may be made of a different material.

Figure 16:
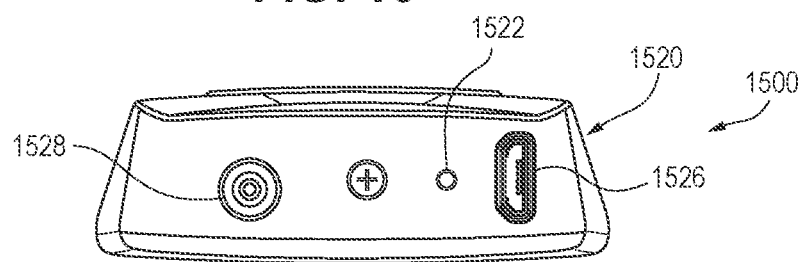
FIG. 16 is a bottom view of the portable biometric lighter of FIG. 15.
Figure 18:
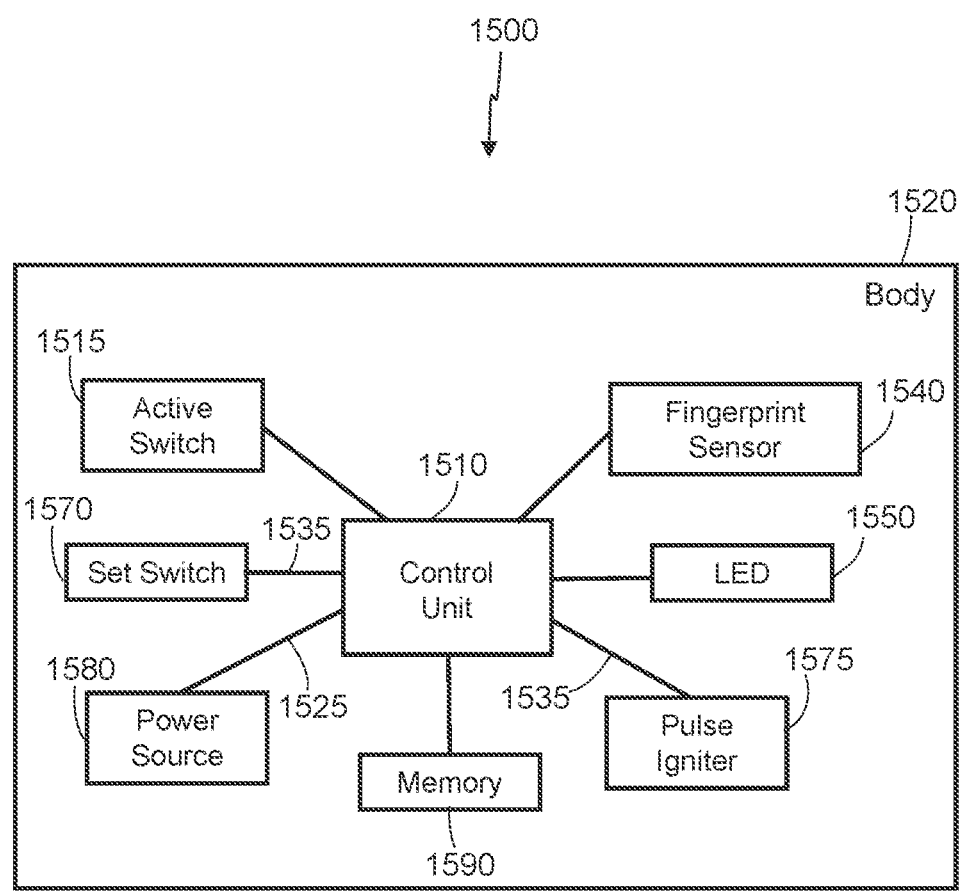
FIG. 18 is a functional block diagram illustrating the portable biometric lighter of FIG. 15 in accordance with some embodiments.

The body 1520 of the portable biometric lighter 1500 of FIG. 15 has a generally rectangular shape, but it will be appreciated that alternative embodiments of the portable biometric lighter 1500 may be of other shapes, for example, square, circular, cylindrical, tubular, oval, or the like. The body 1520 may be formed from any suitable material, for example, a polymer, a plastic, a metal, a heat-resistant material, a composite, or combinations thereof. With reference to FIGS. 15 and 18, in some embodiments, the body 1520 is configured to include one or more of the following elements: a fingerprint sensor 1540, an LED 1550, a control unit 1510, power lines 1525, control lines 1535, a set switch 1570, a gas lever (akin to the one shown in FIG. 3), an active switch 1515, a lighter fluid valve (akin to the one shown in FIG. 3), a nozzle (akin to the one shown in FIG. 3), a pulse igniter 1575, a pole (akin to the one shown in FIG. 3), a lighter fluid reservoir (akin to the one shown in FIG. 3), a power source 1580, and a memory 1090. As can be seen in FIG. 16, the body 1520 of the exemplary portable biometric lighter 1500 includes an aperture 1522 for providing access to the set switch 1570, an aperture 1526 for connecting a USB-based charger, and a turn-knob 1528 for adjusting the size of the flame emitted by the portable biometric lighter 1500.

In the exemplary embodiment illustrated in FIG. 18, the biometric (i.e., fingerprint) sensor 1540 of the portable biometric lighter 1500 is operably coupled to a control unit 1510. The biometric sensor 1540 is housed at least partially within the body 1520 but includes an exterior-facing fingerprint reading surface at a front face of the body 1520 that is accessible by a user and that is configured to scan an authorized user's biometric data (e.g., fingerprint) and any other user's biometric data (e.g., fingerprint), which may be stored in the memory 1590 of the portable biometric lighter 1500.

The LED 1550 of the portable biometric lighter 1500 of FIG. 18 is operably coupled to the control unit 1510 and is configured to provide indications to a user, via blinking and/or solid color or colors, the status of the portable biometric lighter functions including but not limited to setup/teaching mode, low battery, failed scan, and incorrect match. For example, in some embodiments, when the portable biometric lighter 1500 is ready to read a user's fingerprint, the LED 1550 is illuminated in a blue color, when the user's scanned fingerprint matches an authorized user fingerprint stored in the memory 1590, the LED 1550 is illuminated in a green color, and when the user's scanned fingerprint does not match an authorized user fingerprint stored in the memory 1590, the LED 1550 is illuminated in a red color.

The set switch 1570 of the portable biometric lighter 1500 is operably connected to the control unit 1510 and is housed in the body 1520. In the embodiment illustrated in FIGS. 15 and 18, the set switch 1570 is accessible through an aperture 1522 of the body 1520. In some embodiments, the set switch 1570 is configured to activate the control unit 1510 for accepting a new fingerprint, and to optionally erase a prior fingerprint from the memory device 1590 of the portable biometric lighter 1500 if the control unit 1510 is configured to allow erasing a prior fingerprint and accepting a new fingerprint.

With reference to FIG. 18, a power source 1580 is operably coupled to the control unit 1510 and is housed within the body 1520. In some embodiments, the power source 1580 is a primary cell battery, a rechargeable battery, a photo-voltaic cell, or the like. In the embodiment illustrated in FIG. 18, the power source 1580 provides power to the control unit 1510 and/or the fingerprint sensor 1540 via the power lines 1525, but in some approaches, the power source 1580 may be operatively coupled to the control unit 1510 and/or to the fingerprint sensor 1540 via suitable alternative means.

In the embodiment illustrated in FIGS. 15-18, the active switch 1515 is operably coupled to the fingerprint sensor 1540 such that upon a user flipping open the cover 1530, the gas lever of the portable biometric lighter 1500 is pulled up and activates the active switch 1515 via contact force or electromagnetic force. The active switch 1515 upon activation then activates the fingerprint sensor 1540 to read or scan a fingerprint. In some embodiments, upon the user flipping open the cover 1530, the gas lever of the portable biometric lighter 1500 is also configured to lift a nozzle of the portable biometric lighter 1500, which allows the lighter fluid to be released from the lighter fluid valve.

A pulse igniter 1570, such as a piezoelectric based circuit, is configured to produce a high voltage spark from a pole of the portable biometric lighter 1500 to the nozzle of the portable biometric lighter 1500 upon the control unit 1510 determining a match between the scanned biometric data (e.g., fingerprint) of a user and the biometric data (e.g., fingerprint) of an authorized user, which is stored in the memory 1590 of the portable biometric lighter 1500. A flame is subsequently produced when the high voltage sparks come in contact with the lighter fluid that is flowing through the lighter fluid valve to the nozzle.

Figure 19:
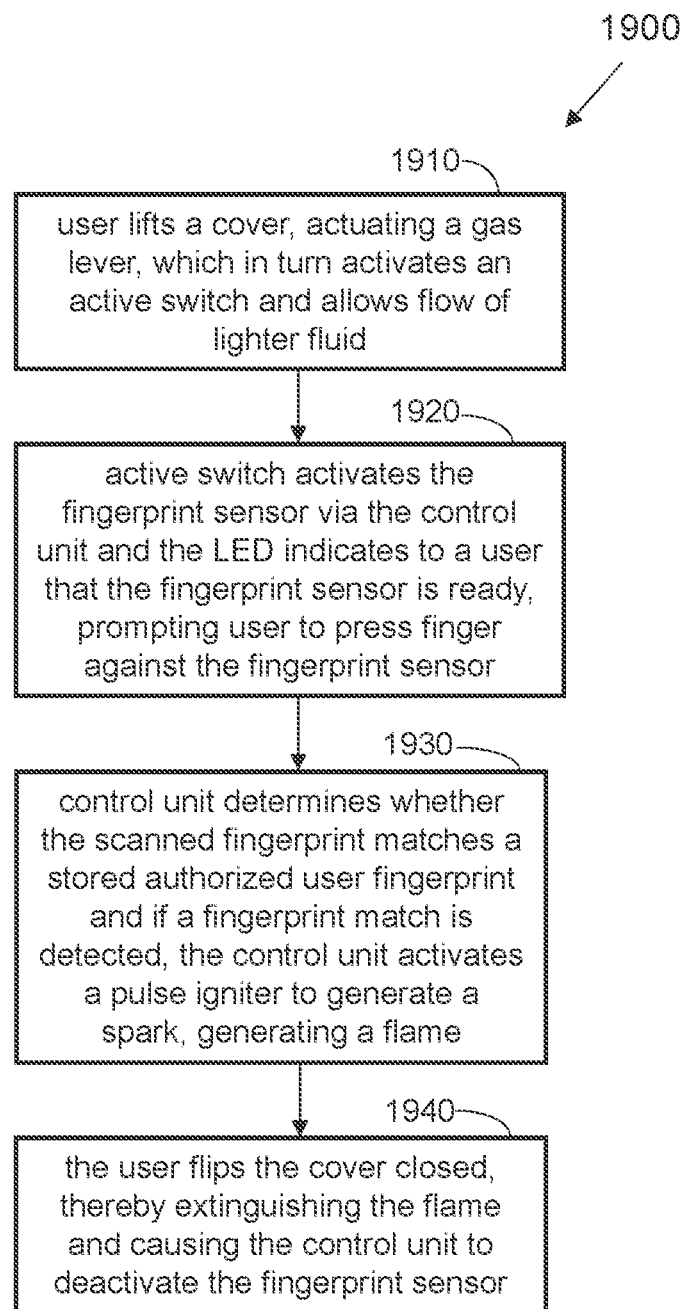
FIG. 19 is a flow chart diagram illustrating a method of igniting the portable biometric lighter of FIG. 15.

Referring to FIG. 19, a flowchart illustrates the steps of a method 1900 of activating, e.g., igniting a flame, by the portable biometric lighter 1500 depicted in FIGS. 15-18. The first step 1910 of the method 1900 of igniting a flame comprises a user opening a cap 1510, thereby actuating a gas lever, which in turn actuates an active switch 1515 via contact pressure or electromagnetic force. The actuation of the gas lever also causes a lifting of a nozzle, which allows lighter fluid to be released from the lighter fluid valve.

The second step 1920 of the method 1900 of igniting a flame comprises the active switch 1515, activating, via the control unit 1510, the fingerprint sensor 1540 to read or to scan a fingerprint and to indicate via the LED 1550 to the user that the fingerprint sensor 1540 is in "scan" or "read" mode, which prompts the user to press or swipe his or her finger against the fingerprint sensor 1540. The third step 1930 of the method 1900 of igniting the flame comprises the control unit 1510 determining whether the scanned fingerprint matches an authorized user's fingerprint that is stored in the memory 1590, and if the control unit 1510 determines that the scanned fingerprint matches an authorized user's fingerprint that is stored in the memory 1590, the control unit 1510 activates a pulse igniter 1570, e.g., a piezoelectric based circuit, thereby generating a plurality of high voltage sparks via the pole to the nozzle, thereby generating a flame via the lighter fluid flowing through the nozzle.

In some embodiments, when the control unit 1510 determines that the scanned fingerprint matches an authorized user's fingerprint that is stored in the memory 1590, the LED 1550 provides a color indication of a match (e.g., via a green color that is continuous or blinking). If, however, the control unit 1510 determines that the scanned fingerprint does not match an authorized user's fingerprint that is stored in memory, the LED 150 will blink in a color (e.g., red) that indicates a mismatch or error, a flame will not be emitted from the opening 1522, and the fingerprint sensor 1540 will subsequently revert to illuminating a color (e.g., blue) indicating the readiness of the fingerprint sensor 1540 to perform another scan of a user's finger. After the user has used the portable biometric lighter 1500 and wishes to deactivate the lighter 1500, the fourth step 1940 of the method 1900 of igniting a flame comprises the user closing the cover 1530, thereby extinguishing the flame and causing the control unit 1510 to deactivate the fingerprint sensor 1540 (e.g., place the fingerprint sensor 1540 in sleep mode).

Information as herein shown and described in detail is fully capable of attaining the above-described object of the invention, the presently preferred embodiment of the invention, and is, thus, representative of the subject matter which is broadly contemplated by the present invention. The scope of the present invention fully encompasses other embodiments which may become obvious to those skilled in the art, and is to be limited, accordingly, by nothing other than the appended claims, wherein reference to an element in the singular is not intended to mean "one and only one" unless explicitly so stated, but rather "one or more." All structural and functional equivalents to the elements of the above-described preferred embodiment and additional embodiments that are known to those of ordinary skill in the art are hereby expressly incorporated by reference and are intended to be encompassed by the present claims.

Moreover, no requirement exists for a device or method to address each and every problem sought to be resolved by the present invention, for such to be encompassed by the present claims. Furthermore, no element, component, or method step in the present disclosure is intended to be dedicated to the public regardless of whether the element, component, or method step is explicitly recited in the claims. However, that various changes and modifications in form, material, and fabrication material detail may be made, without departing from the spirit and scope of the inventions as set forth in the appended claims, should be readily apparent to those of ordinary skill in the art. No claim herein is to be construed under the provisions of 35 U.S.C. § 112, sixth paragraph, unless the element is expressly recited using the phrase "means for."

The present invention industrially applies to lighters and igniters. More specifically, the present invention industrially applies to portable biometric lighter devices. Even more specifically, the present invention industrially applies to portable biometric lighter devices using biometric data to prevent unauthorized usage, e.g., by a minor child.

Those skilled in the art will recognize that a wide variety of other modifications, alterations, and combinations can also be made with respect to the above described embodiments without departing from the scope of the invention, and that such modifications, alterations, and combinations are to be viewed as being within the ambit of the inventive concept.

What is claimed:

1. A portable biometric lighter device, comprising:
a moveable cap;
a control unit operably coupled to an igniter, the igniter coupled to a flammable power source ignitable upon operation of the igniter;
a memory device coupled to the control unit and configured to store biometric data including at least one fingerprint of at least one authorized user;
a biometric sensor, the movable cap configured to move between a deactivated position and an activated position and to activate the biometric sensor and a gas lever when the movable cap is moved toward the activated position, the biometric sensor being operably connected to the control unit and configured to scan a fingerprint of a user; and
an igniter operably coupled to the control unit and configured to ignite the flammable power source to produce a flame in response to being activated by the control unit upon a determination by the control unit that the fingerprint of the user scanned by the biometric sensor matches the biometric data of the authorized user stored in a memory device.

2. The device of claim 1, wherein the biometric sensor comprises a fingerprint sensor.

3. The device of claim 1, wherein the biometric data comprises a fingerprint.

4. The device of claim 1, wherein the igniter is a piezoelectric pulse igniter.

5. The device of claim 1, further comprising an active switch operably coupled to a biometric sensor, and configured to activate, via the control unit, the biometric sensor, wherein the gas lever is configured to activate the active switch when the gas lever is actuated.

6. The device of claim 1, further comprising a light source configured to provide status of the biometric sensor and to indicate, to the user, that the biometric sensor is ready to scan biometric data of the user.

7. A method for lighting a portable biometric lighter device, the method comprising:
providing a moveable cap;
providing a control unit operably coupled to an igniter, the igniter coupled to a flammable power source ignitable upon operation of the igniter;
providing a memory device coupled to the control unit storing biometric data including at least one fingerprint of at least one authorized user;
providing a biometric sensor, the movable cap configured to move between a deactivated position and an activated position and to activate the biometric sensor and a gas lever when the movable cap is moved toward the activated position, the biometric sensor being operably connected to the control unit and configured to scan a fingerprint of a user;
providing an igniter operably coupled to the control unit and configured to ignite the flammable power source to produce a flame in response to being activated by the control unit;
scanning biometric data of the user via the biometric sensor activated after the movable cap is moved to the activated position;
determining, via the control unit that the fingerprint of the user scanned by the biometric sensor matches the biometric data of the authorized user stored in a memory device; and activating, via the control unit, the igniter in order to ignite the flammable power source via the activated igniter.

8. The method of claim 7, wherein the biometric sensor comprises a fingerprint sensor.

9. The method of claim 7, wherein the biometric data comprises a fingerprint.

10. The method of claim 7, wherein the igniter is a piezoelectric pulse igniter.

11. The method of claim 7, further comprising:
providing an active switch operably coupled to a biometric sensor and configured to activate, via the control unit, the biometric sensor;
activating, via the actuated gas lever, the active switch.

12. The method of claim 7, further comprising providing a light source configured to provide status of the biometric sensor and to indicate, to the user, that the biometric sensor is ready to scan biometric data of the user.

* * * * *